(12) United States Patent
Paek et al.

(10) Patent No.: US 12,432,935 B2
(45) Date of Patent: Sep. 30, 2025

(54) SEMICONDUCTOR MEMORY DEVICE

(71) Applicant: SAMSUNG ELECTRONICS CO., LTD., Suwon-si (KR)

(72) Inventors: Jong Hyun Paek, Suwon-si (KR); Woo Jun Jeong, Suwon-si (KR); Seul Ji Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 393 days.

(21) Appl. No.: 18/113,717

(22) Filed: Feb. 24, 2023

(65) Prior Publication Data

US 2023/0354616 A1 Nov. 2, 2023

(30) Foreign Application Priority Data

May 2, 2022 (KR) ........................ 10-2022-0054034

(51) Int. Cl.
*H10B 63/00* (2023.01)
*H10N 70/00* (2023.01)

(52) U.S. Cl.
CPC ............. *H10B 63/24* (2023.02); *H10B 63/84* (2023.02); *H10N 70/841* (2023.02)

(58) Field of Classification Search
CPC ........ H10B 63/20; H10B 63/24; H10B 63/84; H10N 70/841; H10N 70/881
See application file for complete search history.

(56) References Cited

U.S. PATENT DOCUMENTS

| | | |
|---|---|---|
| 9,299,929 B2 | 3/2016 | Gotti et al. |
| 10,424,374 B2 | 9/2019 | Redaelli et al. |
| 10,424,730 B2 | 9/2019 | Pirovano et al. |
| 10,693,065 B2 | 6/2020 | Redaelli et al. |
| 10,825,863 B2 | 11/2020 | Redaelli |
| 10,854,813 B2 | 12/2020 | Tortorelli et al. |
| 10,892,406 B2 | 1/2021 | Russell et al. |
| 10,910,438 B2 | 2/2021 | Pellizzer et al. |
| 11,158,561 B2 | 10/2021 | Zheng et al. |
| 11,211,427 B2 | 12/2021 | Lee et al. |

(Continued)

OTHER PUBLICATIONS

European Search Report dated Sep. 22, 2023, of the corresponding EP Application No. 23166913.6.

(Continued)

*Primary Examiner* — Mounir S Amer
(74) *Attorney, Agent, or Firm* — Muir Patent Law, PLLC

(57) ABSTRACT

A semiconductor memory device includes a substrate, a first conductive line disposed on the substrate and extending in a first direction, a second conductive line disposed on the first conductive line, and extending in a second direction intersecting the first direction, and a memory cell disposed between the first conductive line and the second conductive line, wherein the memory cell includes, a first electrode connected to the first conductive line, a second electrode connected to the second conductive line, an OTS film disposed between the first electrode and the second electrode, a high-concentration electrode disposed between the second electrode and the OTS film, wherein a concentration of nitrogen contained in the second electrode is lower than a concentration of nitrogen contained in the high-concentration electrode, wherein a logic state of data stored in the OTS film is based on a polarity of a program voltage.

20 Claims, 18 Drawing Sheets

(56) References Cited

U.S. PATENT DOCUMENTS

| 12,150,394 B2 * | 11/2024 | Yang ..................... H10N 70/063 |
| 2009/0134431 A1 | 5/2009 | Tabata et al. |
| 2013/0048935 A1 | 2/2013 | Gotti et al. |
| 2018/0315475 A1 | 11/2018 | Redaelli et al. |
| 2021/0151673 A1 | 5/2021 | Pirovano et al. |
| 2021/0249598 A1 | 8/2021 | Zheng et al. |
| 2021/0287960 A1 | 9/2021 | Economy et al. |
| 2021/0408114 A1 * | 12/2021 | Lille ..................... H10B 61/10 |
| 2022/0310916 A1 * | 9/2022 | Cho ..................... H10N 70/231 |
| 2024/0147735 A1 * | 5/2024 | Heo ..................... H10B 61/10 |

OTHER PUBLICATIONS

European Office Action dated Oct. 6, 2023, of the corresponding EP Application No. 23166913.6.

\* cited by examiner

SEMICONDUCTOR MEMORY DEVICE

CROSS-REFERENCE TO RELATED APPLICATION

This application claims priority from Korean Patent Application No. 10-2022-0054034, filed on May 2, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor memory device. More specifically, the present disclosure relates to a semiconductor memory device with improved reliability in which a high-concentration electrode is additionally disposed between an ovonic threshold switch (OTS) film and an electrode.

2. Description of Related Art

A semiconductor memory device may be used to store information in various electronic devices, e.g., computers, wireless communication devices, cameras, digital displays, and the like. Information may be stored by programming different states of the semiconductor memory device. For example, the semiconductor memory device may have two states expressed as logic "1" or logic "0". To access the stored information, a component of the electronic device may read or sense the state stored in the semiconductor memory device. To store the information, a component of the electronic device may write or program a state in the semiconductor memory device.

For example, the semiconductor memory device may include a magnetic hard disk, a random access memory (RAM), a dynamic RAM (DRAM), a synchronous dynamic RAM (SDRAM), a ferroelectric RAM (FeRAM,) a magnetic RAM (MRAM), resistive RAM (RRAM), a read only memory (ROM), a flash memory, a phase change memory (PCM), etc. The semiconductor memory device may be volatile or non-volatile. The non-volatile memory, e.g., FeRAM, may retain a stored logic state of the memory for an extended period of time in an event of absence of an external power source. The volatile memory, e.g., DRAM, may lose the state stored in the semiconductor memory device over time unless the volatile memory is periodically refreshed using the external power source. Improving the semiconductor memory device may include increasing a density of memory cells, increasing read/write speeds, increasing reliability, increasing data retention, reducing power consumption, or reducing a manufacturing cost, among measurement criteria.

Some types of semiconductor memory devices may use change in a polarity of voltage applied to a cell to program and sense different logic states. For example, a self-selecting memory may improve a difference between threshold voltages of a memory cell in different programmed states. A scheme in which a cell is programmed may affect distribution of various materials constituting the cell. This may affect ion movement of the cell, which in turn, may affect a threshold voltage of the cell. The threshold voltage may be related to the logic state of the cell. Thus, a small difference between threshold voltages of the cell in the different logic states may affect accuracy at which the cell may be read.

SUMMARY

According to an aspect of the present disclosure, there is provided a semiconductor memory device including, a substrate, a first conductive line disposed on the substrate and extending in a first direction, a second conductive line disposed on the first conductive line, and extending in a second direction intersecting the first direction, and a memory cell disposed between the first conductive line and the second conductive line, wherein the memory cell includes, a first electrode connected to the first conductive line, a second electrode connected to the second conductive line, an OTS (ovonic threshold switch) film disposed between the first electrode and the second electrode, a high-concentration electrode disposed between the second electrode and the OTS film, wherein a concentration of nitrogen contained in the second electrode is lower than a concentration of nitrogen contained in the high-concentration electrode, wherein a logic state of data stored in the OTS film is based on a polarity of a program voltage.

According to another aspect of the present disclosure, there is provided a semiconductor memory device including, a substrate, a first conductive line disposed on the substrate and extending in a first direction, a second conductive line disposed on the first conductive line, and extending in a second direction intersecting the first direction, a third conductive line disposed on the second conductive line, and extending in the first direction, a first memory cell disposed between the first conductive line and the second conductive line, and a second memory cell disposed between the second conductive line and the third conductive line, wherein the first memory cell includes a first electrode, a first OTS film, and a second electrode sequentially stacked, wherein the second memory cell includes a third electrode, a second OTS film, a first high-concentration electrode, and a fourth electrode sequentially stacked, wherein a concentration of nitrogen contained in the first high-concentration electrode is greater than a concentration of nitrogen contained in the fourth electrode.

According to yet another aspect of the present disclosure, there is provided a semiconductor memory device including, a substrate, a first conductive line disposed on the substrate and extending in a first direction, a second conductive line disposed on the first conductive line, and extending in a second direction intersecting the first direction, a third conductive line disposed on the second conductive line, and extending in the first direction, a first memory cell disposed between the first conductive line and the second conductive line, and a second memory cell disposed between the second conductive line and the third conductive line, wherein the first memory cell includes a first electrode, a first OTS film, and a second electrode sequentially stacked, wherein a dimension in each of the first and second directions of the first OTS film gradually decreases as the first OTS film extends away from the substrate, wherein the second memory cell includes a third electrode, a second OTS film, a first high-concentration electrode, and a fourth electrode sequentially stacked, wherein a dimension in each of the first and second directions of the second OTS film gradually increases as the second OTS film extends away from the substrate.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, an operating method of a semiconductor memory device according to some embodiments will be described with reference to FIG. 1.

Figure 1:
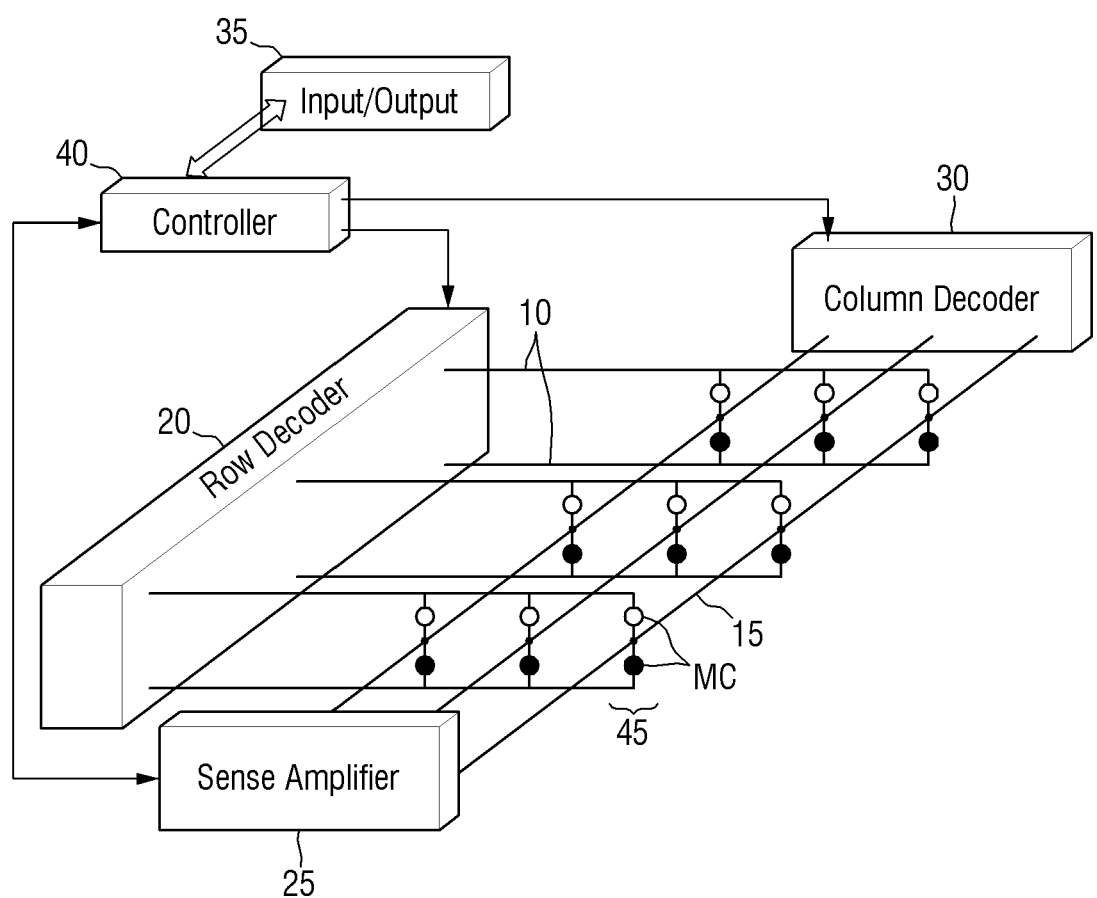
FIG. 1 is a diagram of an operation method of a semiconductor memory device according to some embodiments.

FIG. 1 is a diagram for illustrating an operation method of a semiconductor memory device according to some embodiments.

Referring to FIG. 1, a semiconductor memory device according to some embodiments may include at least one memory cell MC. Each memory cell MC may be programmable to store therein two states expressed as logic "0" and logic "1". In some embodiments, the memory cell MC may store therein at least three logic states.

The memory cell MC may include an information storage element indicating a logic state. The information storage element may include chalcogenide material. The chalcogenide material may have a variable threshold voltage or a variable resistance. The chalcogenide material may function as an information storage element. The chalcogenide material may include a compound as a combination of at least one of, e.g., S, Te, and Se, as chalcogen elements, and at least one of, e.g., Ge, Sb, Bi, Al, Tl, Sn, Zn, As, Si, In, Ti, Ga, and P.

In some embodiments, a threshold voltage of a cell may be changeable depending on a polarity used to program the cell. For example, a self-selecting memory cell programmed with one polarity may have one threshold voltage according to a specific resistance. Further, the self-selecting memory cell may be programmed with different polarities that may generate different threshold voltages according to different resistance characteristics of the self-selecting memory cell. When the self-selecting memory cell is programmed, ion migration in the chalcogenide material may occur. The ions may move toward a specific electrode based on a predetermined cell polarity. For example, in the self-selecting memory cell, the ions may migrate towards a negative electrode. The self-selecting memory cell may then be read by applying a voltage to the self-selecting memory cell to detect which electrode the ions have moved toward.

In some embodiments, the threshold voltage of the cell may be adjusted using a crystalline structure or an atomic arrangement of the chalcogenide material. For example, a material with crystalline arrangement of atoms and a material with amorphous arrangement of atoms may have different resistances. The crystalline state may have a low resistance. The amorphous state may have a high resistance. Therefore, a voltage applied to the memory cell MC may generate different currents depending on whether the chalcogenide material is in the crystalline or amorphous state. Further, a magnitude of the generated current may determine a logic state stored by the memory cell MC.

A memory array of semiconductor memory devices according to some embodiments may have a two-dimensional (2D) structure, or a three-dimensional (3D) structure. The three-dimensional (3D) memory array may have a structure in which memory cells MC are vertically stacked. The three-dimensional memory array may increase the number of memory cells MC that can be formed on one substrate, compared to that in the two-dimensional memory array. In FIG. 1, the memory cells MC may be arranged into the three-dimensional memory array including two layers. However, the technical idea of the present disclosure is not limited thereto. Memory cells MC of layers may be aligned with each other. The memory cells MC may constitute a memory cell stack 45.

Each row of the memory cell MC may be connected to a first conductive line 10, and a second conductive line 15. For example, the first conductive line 10 may be a word-line, and the second conductive line 15 may be a bit-line. The first conductive line 10 and the second conductive line 15 may extend substantially in a manner perpendicular to each other.

In some embodiments, one memory cell MC may be disposed at an intersection of the first conductive line 10 and the second conductive line 15. The intersection may be referred to as an address of the memory cell MC. A target memory cell MC may be located at the intersection of the word-line and the bit-line to which voltage is applied. That is, the first conductive line 10 and the second conductive line 15 may function to read or write the memory cell MC at the intersection therebetween.

In some embodiments, the reading and writing may include applying a voltage or current to each conductive line. The reading and writing may be performed on the memory cell MC by activating or selecting the first conductive line 10 and the second conductive line 15. Each of the first conductive line 10 and the second conductive line 15 may include a conductive material. For example, the conductive material may include a metal material, e.g., copper (Cu), aluminum (Al), gold (Au), tungsten (W), titanium (Ti), or the like, a metal alloy thereof, carbon, a conductively doped semiconductor material, and/or other conductive materials. When the memory cell MC is selected, the cell may be influenced so as to set the logic state of the cell as a movement of, e.g., selenium (Se) ions.

For example, the memory cell MC may be programmed by applying an electrical pulse to the chalcogenide material including selenium (Se). The pulse may be provided thereto, e.g., via the first conductive line 10 or the second conductive line 15. When the pulse is applied thereto, selenium (Se) ions may migrate within the information storage element based on a polarity of the memory cell MC. Therefore, a concentration of selenium (Se) on a surface of the information storage element may be affected by a polarity of a voltage between the first conductive line 10 and the second conductive line 15.

A voltage may be applied to the memory cell MC to read the cell. A threshold voltage when a current generated via the application of the voltage starts to flow may indicate a state of logic "1" or logic "0". A difference between concentrations of selenium (Se) ions at both opposing ends of the information storage element may affect the threshold voltage. The difference between the concentrations of selenium (Se) ions at the opposing ends of the information storage element may cause a larger difference between cell responses in different logic states.

Access to the memory cell MC may be controlled via a row decoder 20 and a column decoder 30. For example, the row decoder 20 may receive a row address from a controller 40. Further, the row decoder 20 may activate an appropriate first conductive line 10 based on the row address received from the controller 40. Similarly, the column decoder 30 may receive a column address from the controller 40. Further, the column decoder 30 may activate the second conductive line 15 based on the column address received from the controller 40. The device may access the memory cell MC by activating the first conductive line 10 and the second conductive line 15.

When the device accesses the memory cell MC, the memory cell MC may be read or sensed using a sensing amplifier 25. For example, the sensing amplifier 25 may determine a logic state stored in the memory cell MC based on a signal generated by accessing the memory cell MC. The generated signal may include voltage or current. Accordingly, the sensing amplifier 25 may include a voltage sensing amplifier and/or a current sensing amplifier.

For example, a voltage may be applied to the memory cell MC. A magnitude of the current generated by the applied voltage may depend on a resistance of the memory cell MC. Similarly, a current may be applied to the memory cell MC. A magnitude of a voltage for generating the current may depend on the resistance of the memory cell MC. The sensing amplifier 25 may include various transistors or amplifiers to detect and amplify a signal. This may also be referred to as latching. Subsequently, the detected logic state of the memory cell MC may be output through an input/output device. In one example, the sensing amplifier 25 may be a portion of the column decoder 30 or the row decoder 20. Alternatively, the sensing amplifier 25 may be connected to, or may communicate with, the column decoder 30 or the row decoder 20.

The memory cell MC may be programmed or written by activating the first conductive line 10 and the second conductive line 15. A logic value may be stored in the memory cell MC. The column decoder 30 or the row decoder 20 may receive data to be written into the memory cell MC, e.g., an input/output 35. In a phase change memory or a self-selecting memory, the memory cell MC may be written by heating the information storage element, e.g., by passing a current through the memory storage device. Selenium (Se) ions may be concentrated on a specific electrode based on a logic state written into the memory cell MC, e.g., logic "1" or logic "0".

For example, depending on the polarity of the memory cell MC, the selenium (Se) ions concentrated on a first electrode may generate a first threshold voltage indicating a logic "1" state. The selenium (Se) ions concentrated on a second electrode may generate a second gate voltage indicating a logic "0" state. The first threshold voltage and the second threshold voltage may be different from each other. As a difference between the first threshold voltage and the second threshold voltage increases, the semiconductor memory device may have more improved reliability.

The controller 40 may control operations (e.g., read, write, rewrite, refresh, discharge, etc.) of the memory cell MC using various components, e.g., the row decoder 20, the column decoder 30, and the sensing amplifier 25. In some embodiments, at least one of the row decoder 20, the column decoder 30, and the sensing amplifier 25 may be co-located with the controller 40. The controller 40 may generate row and column address signals to activate a target first conductive line 10 and a target second conductive line 15. The controller 40 may also generate and control various voltages or currents used during an operation of the memory array. For example, the controller 40 may access one or more memory cells MC and then may apply a discharge voltage to the first conductive line 10 or the second conductive line 15.

Hereinafter, a semiconductor memory device according to some embodiments will be described with reference to FIGS. 2 to 10. Although the drawings illustrate that the semiconductor memory device according to some embodiments is embodied as a self-selecting memory, any suitable memory may be implemented.

Figure 2:
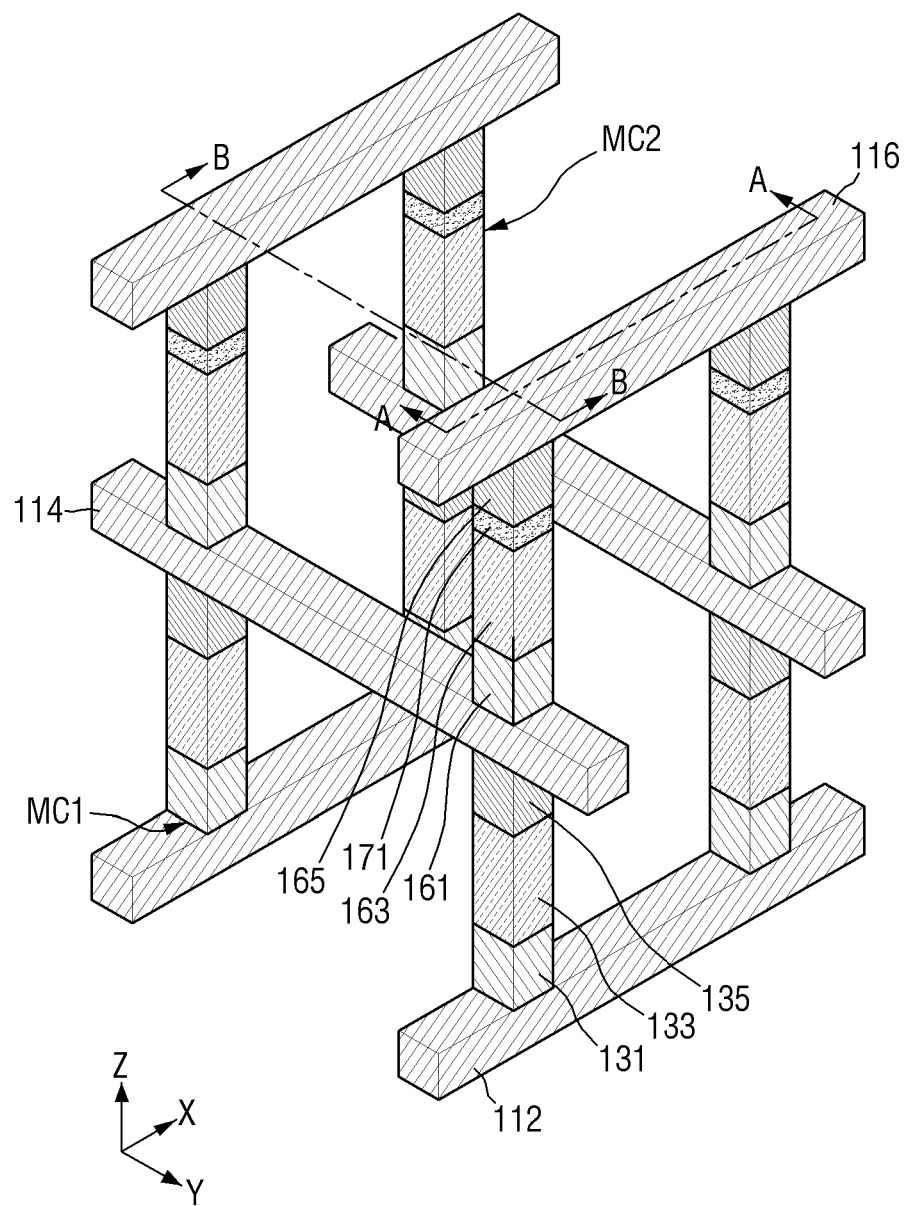
FIG. 2 is a schematic perspective view of a semiconductor memory device according to some embodiments.
Figure 3:
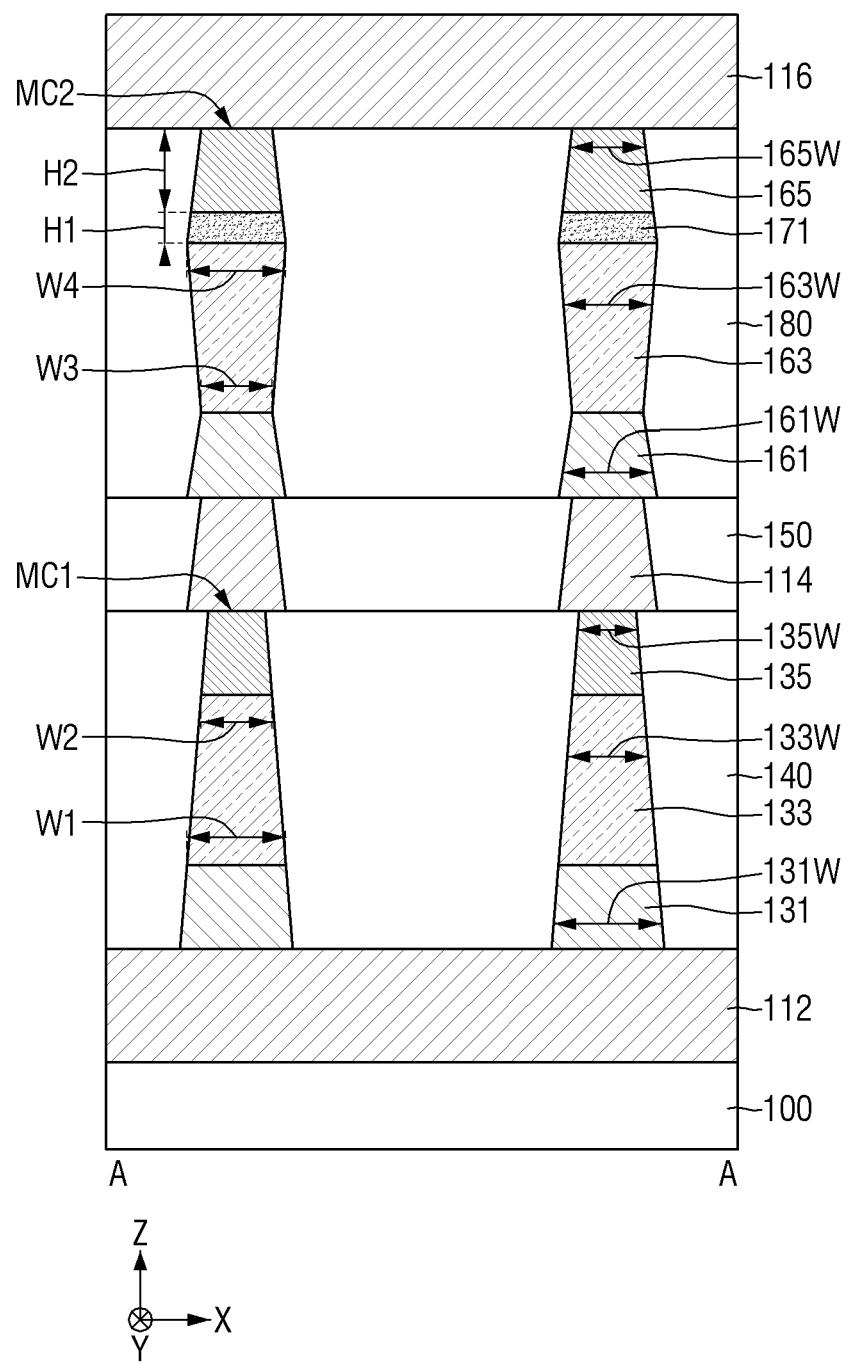
FIG. 3 is a cross-sectional view along line A-A of FIG. 2.
Figure 4:
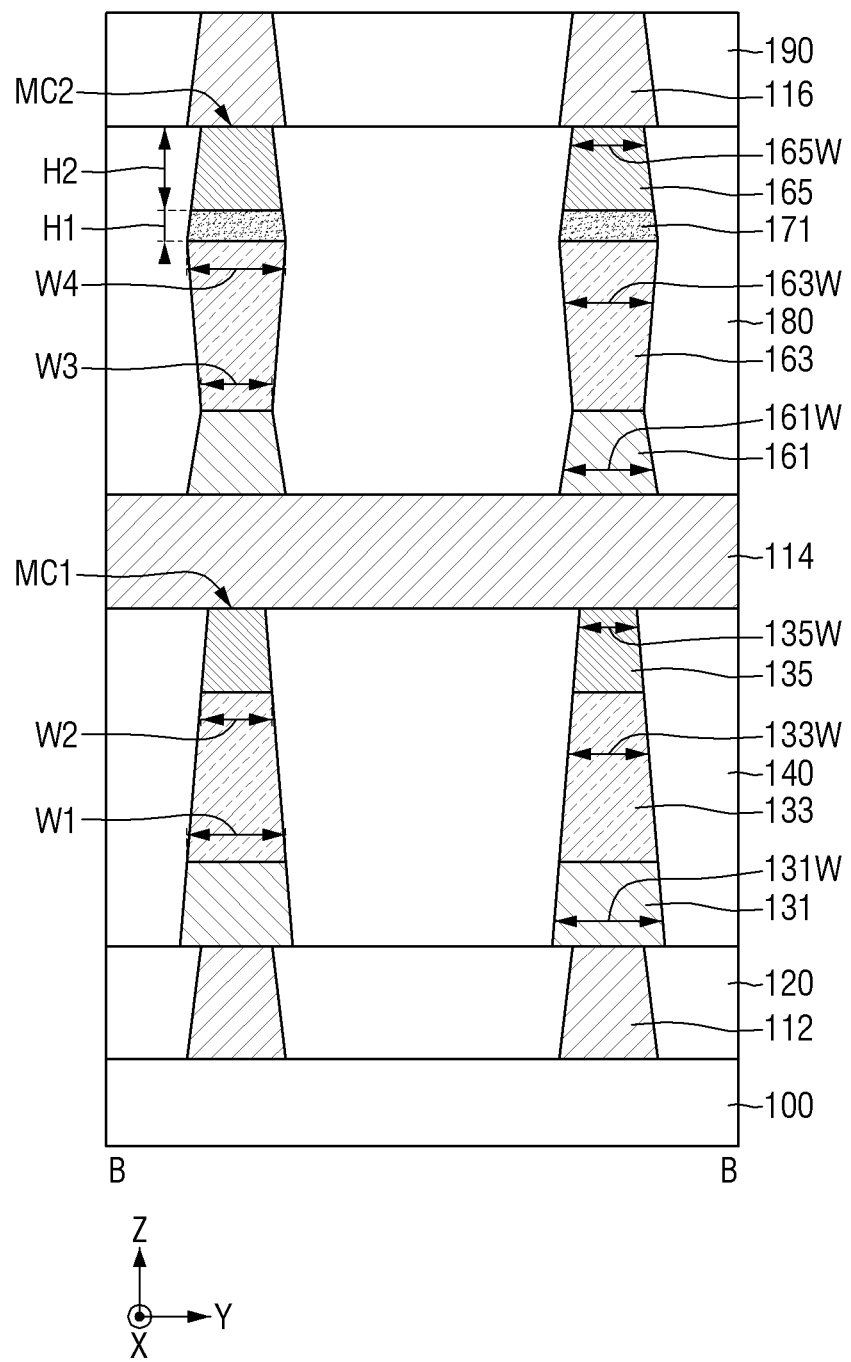
FIG. 4 is a cross-sectional view along line B-B of FIG. 2.

FIG. 2 is an illustrative perspective view of a semiconductor memory device according to some embodiments. FIG. 3 is a cross-sectional view along line A-A of FIG. 2. FIG. 4 is a cross-sectional view along line B-B of FIG. 2.

Referring to FIGS. 2 to 4, the semiconductor memory device according to some embodiments may include a substrate 100, a first conductive line 112, a second conductive line 114, a third conductive line 116, a first memory cell MC1, and a second memory cell MC2

The substrate 100 may be a semiconductor substrate. For example, the substrate 100 may be made of bulk silicon or SOI (silicon-on-insulator). The substrate 100 may be embodied as a silicon substrate, or may include a material other than silicon, e.g., silicon germanium, indium antimonide, lead telluride, indium arsenide, indium phosphide, gallium arsenide, or gallium antimonide. In another example, the substrate 100 may include a base substrate and an epitaxial layer formed on the base substrate.

On the substrate 100, the first conductive line 112, the second conductive line 114, and the third conductive line 116 may be disposed.

The first conductive line 112 may extend in a first direction X. At least one first conductive line 112 may be provided. The first conductive lines 112 may be spaced apart from each other in a second direction Y. As used herein, the first direction X, the second direction Y, and a third direction Z may intersect each other. The first direction X, the second direction Y, and the third direction Z may be substantially perpendicular to each other.

The first conductive line 112 may be the first conductive line 10 of FIG. 1. That is, the first conductive line 112 may function as a word-line in the semiconductor memory device according to some embodiments.

The second conductive line 114 may be disposed on the first conductive line 112. At least one second conductive line 114 may be provided. The second conductive line 114 may be spaced apart from the first conductive line 112 in the third direction Z. Each of the second conductive lines 114 may extend in the second direction Y. The second conductive lines 114 may be spaced apart from each other in the first direction X.

The second conductive line 114 may be the second conductive line 15 in FIG. 1. That is, the second conductive line 114 may function as a bit-line in the semiconductor memory device according to some embodiments.

The third conductive line 116 may be disposed on the second conductive line 114. At least one third conductive line 116 may be provided. Each of the third conductive lines 116 may be spaced apart from the first and second conductive lines 112 and 114 in the third direction Z. Each of the third conductive lines 116 may extend in the first direction X. The third conductive lines 116 may be spaced apart from each other in the second direction Y.

The third conductive line 116 may be the first conductive line 10 of FIG. 1. That is, the third conductive line 116 may function as a word-line in the semiconductor memory device according to some embodiments.

In some embodiments, each of the first and third conductive lines 112 and 116 may extend in the first direction X, and the second conductive line 114 may extend in the second direction Y. The second conductive line 114 may be interposed between the first and third conductive lines 112 and 116, e.g., in the third direction Z.

Each of the first to third conductive lines 112, 114, and 116 may include a conductive material. For example, each of the first to third conductive lines 112, 114, and 116 may include at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof.

The first to third conductive lines 112, 114, and 116 may include the same material, or may include different materials from each other. In the present disclosure, a case in which each of the first to third conductive lines 112, 114, and 116 includes tungsten (W) is described.

In some embodiments, a first interlayer insulating film 120 may be disposed between the first conductive lines 112. The first interlayer insulating film 120 may be disposed on the substrate 100. The first interlayer insulating film 120 may be interposed between the first conductive lines 112 to electrically insulate the first conductive lines 112 from each other.

A second interlayer insulating film 150 may be disposed between the second conductive lines 114. The second interlayer insulating film 150 may be disposed on the first memory cell MC1. The second interlayer insulating film 150 may be interposed between the second conductive lines 114 to electrically insulate the second conductive lines 114 from each other.

A third interlayer insulating film 190 may be disposed between the third conductive lines 116. The third interlayer insulating film 190 may be disposed on the second memory cell MC2. The third interlayer insulating film 190 may be interposed between the third conductive lines 116 to electrically insulate the third conductive lines 116 from each other.

Each of the first to third interlayer insulating films 120, 150, and 190 may include an oxide-based insulating material. For example, each of the first to third interlayer insulating films 120, 150, and 190 may include at least one of silicon oxide, silicon oxynitride, and a low dielectric constant (low-k material) having a dielectric constant smaller than that of silicon oxide.

The first memory cell MC1 may be disposed between the first conductive line 112 and the second conductive line 114. The first memory cell MC1 may be disposed at an intersection of the first conductive line 112 and the second conductive line 114. One end of the first memory cell MC1 may be connected to the word-line of the semiconductor memory device. The other end of the first memory cell MC1 may be connected to the bit-line of the semiconductor memory device. At least one first memory cell MC1 may be provided. The first memory cells MC1 may be spaced apart from each other in the first direction X and may be spaced apart from each other in the second direction Y. Each of the first memory cells MC1 may extend in the third direction Z.

In some embodiments, the first memory cell MC1 may include a first electrode 131, a first OTS film 133, and a second electrode 135. The first electrode 131, the first OTS film 133, and the second electrode 135 may be sequentially arranged in the third direction Z. The first electrode 131 may be disposed on the first conductive line 112. The first OTS film 133 may be disposed on the first electrode 131. The second electrode 135 may be disposed on the first OTS film 133. The first OTS film 133 may be interposed between the first electrode 131 and the second electrode 135.

The first electrode 131 may be connected to the first conductive line 112. The first electrode 131 may contact the first conductive line 112. The first electrode 131 may include a conductive material. In one example, the first electrode 131 may include carbon (C). In another example, the first electrode 131 may include at least one of a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc., a metal nitride, e.g., titanium nitride (TiN), and combinations thereof.

The second electrode 135 may be disposed on the first electrode 131. The second electrode 135 may be connected to the second conductive line 114. The second electrode 135 may contact the second conductive line 114. The second electrode 135 may include a conductive material. In one example, the second electrode 135 may include carbon (C). In another example, the second electrode 135 may include at least one of a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc., a metal nitride, e.g., titanium nitride (TiN), and combinations thereof.

The first OTS film 133 may be disposed between the first electrode 131 and the second electrode 135. The first OTS film 133 may be connected to the first electrode 131 and the second electrode 135. In some embodiments, the first OTS film 133 may function as an information storage element of the first memory cell MC1. The first OTS film 133 may include chalcogenide material. The chalcogenide material may include a compound as a combination of at least one of, e.g., S, Te, and Se as chalcogen elements, and at least one of, e.g., Ge, Sb, Bi, Al, Tl, Sn, Zn, As, Si, In, Ti, Ga, and P.

In one example, the first OTS film 133 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAs- SeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The semiconductor memory device according to some embodiments may store therein data based on movement of ions contained in the first OTS film 133. A logic state of the data stored in the first OTS film 133 may be based on a polarity of a program voltage. For example, when a voltage is applied to the first electrode 131 and the second electrode 135, ions contained in the first OTS film 133 may move toward the first electrode 131 and the second electrode 135. In one example, the first OTS film 133 may contain selenium (Se) ions. When a voltage is applied to the first electrode 131 and the second electrode 135, the selenium (Se) ions in the first OTS film 133 may move toward the first electrode 131 or the second electrode 135.

For example, based on a polarity of the first memory cell MC1, the selenium (Se) ions concentrated on the first electrode 131 may generate a first threshold voltage indicating a logic "1" state. Depending on the polarity of the first memory cell MC1, the selenium (Se) ions concentrated on the second electrode 135 may generate a second threshold voltage indicating a logic "0" state. The first threshold voltage and the second threshold voltage may be different from each other. As the difference between the first threshold voltage and the second threshold voltage increases, the semiconductor memory device may have improved reliability.

In some embodiments, a dimension 131W in each of the first and second directions X and Y of the first electrode 131 may be gradually, e.g., continuously and steadily along a slope profile, decreased as the electrode 131 extends away from the substrate 100. A dimension 135W in each of the first and second directions X and Y of the second electrode 135 may decrease gradually as the electrode 135 extends away from the substrate 100. A dimension 133W in each of the first and second directions X and Y of the first OTS film 133 may be gradually decreased as the film 133 extends away from the substrate 100. That is, each of the first electrode 131, the second electrode 135, and the first OTS film 133 may have a trapezoidal shape in a cross-sectional view. In a cross-sectional view, each of the first electrode 131, the second electrode 135, and the first OTS film 133 may have a trapezoidal shape in which a length of a side adjacent to the first conductive line 112 among two parallel sides is larger than a length of a side adjacent to the second conductive line 114 among the two parallel sides.

In some embodiments, the first OTS film 133 may contact the first electrode 131 and the second electrode 135. A contact surface, e.g., an interface, between the first OTS film 133 and the first electrode 131 may have a first dimension W1 in each of the first and second directions X and Y. A contact surface, e.g., interface, between the first OTS film 133 and the second electrode 135 may have a second dimension W2 in each of the first and second directions X and Y. The first dimension W1 may be greater than the second dimension W2. It is noted that while the first and second dimensions W1 and W2 in the drawings are illustrated as spaced apart from the interfaces, this is only for clarity of illustration of the arrows, and the first and second dimensions W1 and W2 refer to the widths of the interfaces between the first OTS film 133 and each of the first and second electrodes 131 and 135, respectively.

The semiconductor memory device according to some embodiments may further include a first cell insulating film 140. The first cell insulating film 140 may surround the first memory cell MC1. The first cell insulating film 140 may electrically insulate the first memory cells MC1 from each other. The first cell insulating film 140 may include an oxide-based insulating material. For example, the first cell insulating film 140 may include at least one of silicon oxide, silicon oxycarbide, and a low thermal conductivity material having lower thermal conductivity than that of silicon oxide.

In one example, the first cell insulating film 140 may include at least one of $SiO_2$, SiOC, SOG (Spin-On glass), SOD (Spin-On Dielectric), HDP (High Density Plasma) oxide, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), TEOS (Tetra Ethyl Ortho Silicate), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof. In some embodiments, the first cell insulating film 140 may include FOX (Flowable Oxide).

The second memory cell MC2 may be disposed between the second conductive line 114 and the third conductive line 116. The second memory cell MC2 may be disposed at an intersection of the second conductive line 114 and the third conductive line 116. One end of the second memory cell MC2 may be connected to the word-line of a semiconductor memory device. The other end of the second memory cell MC2 may be connected to the bit-line of a semiconductor memory device. At least one second memory cell MC2 may be provided. The second memory cells MC2 may be spaced apart from each other in the first direction X and the second direction Y. The second memory cell MC2 may extend in the third direction Z.

In some embodiments, the second memory cell MC2 may include a third electrode 161, a second OTS film 163, a fourth electrode 165, and a first high-concentration electrode 171. The third electrode 161, the second OTS film 163, the first high-concentration electrode 171, and the fourth electrode 165 may be sequentially arranged in the third direction Z. The third electrode 161 may be disposed on the second conductive line 114. The second OTS film 163 may be disposed on the third electrode 161. The first high-concentration electrode 171 may be disposed on the second OTS film 163. The fourth electrode 165 may be disposed on the first high-concentration electrode 171.

The third electrode 161 may be connected to the second conductive line 114. The third electrode 161 may contact the second conductive line 114. The third electrode 161 may include a conductive material. In one example, the third electrode 161 may include carbon (C). In another example, the third electrode 161 may include at least one of a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc., a metal nitride, e.g., titanium nitride (TiN), and combinations thereof.

The fourth electrode 165 may be disposed on the third electrode 161. The second electrode 165 may be connected to the third conductive line 116. The fourth electrode 165 may contact the third conductive line 116. The second electrode 165 may include a conductive material. In one example, the second electrode 165 may include carbon (C). In another example, the second electrode 135 may include at least one of a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc., a metal nitride, e.g., titanium nitride (TiN), and combinations thereof.

The second OTS film 163 may be disposed between the third electrode 161 and the fourth electrode 135. The second OTS film 163 may be disposed between the third electrode 161 and the first high-concentration electrode 171. The second OTS film 163 may be connected to the third electrode 161 and the fourth electrode 165. In some embodiments, the second OTS film 163 may function as an information storage element of the second memory cell MC2. The second OTS film 163 may include chalcogenide material. The chalcogenide material may include a compound as a combination of at least one of, e.g., S, Te, and Se as chalcogen elements, and at least one of, e.g., Ge, Sb, Bi, Al, Tl, Sn, Zn, As, Si, In, Ti, Ga, and P.

In one example, the second OTS film 163 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The first high-concentration electrode 171 may be disposed between the second OTS film 163 and the fourth electrode 165. One end of the first high-concentration electrode 171 may contact the second OTS film 163. The other end of the first high-concentration electrode 171 may contact the fourth electrode 165. The first high-concentration electrode 171 may include carbon (C). Further, the first high-concentration electrode 171 may contain nitrogen (N). That is, the first high-concentration electrode 171 may be made of carbon (C) containing nitrogen (N).

In some embodiments, a concentration of nitrogen (N) contained in the first high-concentration electrode 171 may be greater than a concentration of nitrogen (N) contained in the fourth electrode 165. Impurity contained in the first high-concentration electrode 171 may not be nitrogen (N). Even in this case, a concentration of impurities contained in the first high-concentration electrode 171 may be greater than a concentration of impurities contained in the fourth electrode 165.

In some embodiments, concentrations of nitrogen (N) contained in the first to fourth electrodes 131, 135, 161, and 165 may be equal to each other. That is, the concentration of nitrogen (N) contained in the first high-concentration electrode 171 is greater than the concentration of nitrogen (N) contained in each of the first to fourth electrodes 131, 135, 161, and 165.

The semiconductor memory device according to some embodiments may store therein data based on movement of ions contained in the second OTS film 163. A logic state of the data stored in the second OTS film 163 may be based on a polarity of a program voltage. For example, when voltage is applied to the third electrode 161 and the fourth electrode 165, ions contained in the second OTS film 163 may move toward the third electrode 161, the first high-concentration electrode 171, or the fourth electrode 165. In one example, the second OTS film 163 may contain selenium (Se) ions. When voltage is applied to the third electrode 161 and the fourth electrode 165, the selenium (Se) ions in the second OTS film 163 may move toward the third electrode 161, the fourth electrode 165, or the first high-concentration electrode 171.

For example, depending on a polarity of the second memory cell MC2, the selenium (Se) ions concentrated on the third electrode 161 may generate a first threshold voltage indicating a logic "1" state. Depending on the polarity of the second memory cell MC2, the selenium (Se) ions concentrated on the first high-concentration electrode 171 may generate a second threshold voltage indicating a logic "0" state. The first threshold voltage and the second threshold voltage may be different from each other. As the difference between the first threshold voltage and the second threshold voltage increases, the semiconductor memory device may have improved reliability.

In some embodiments, a dimension 161W in each of the first and second directions X and Y of the third electrode 161 may be gradually decreased as the electrode 161 extends away from the substrate 100. A dimension 165W in each of the first and second directions X and Y of the fourth electrode 165 may decrease gradually as the electrode 165 extends away from the substrate 100. A dimension 163W in each of the first and second directions X and Y of the second OTS film 163 may be gradually increased as the film 163 extends away from the substrate 100. That is, each of the first electrode 131, the second electrode 135, and the first OTS film 133 may have a trapezoidal shape in a cross-sectional view.

For example, each of the third electrode 161 and the fourth electrode 165 have a trapezoidal shape in which a length of a side adjacent to the second conductive line 114 among two parallel sides is greater than a length of a side adjacent to the third conductive line 116 among the two parallel sides in the cross-sectional view. To the contrary, the second OTS film 163 may have a trapezoidal shape in which a length of a side adjacent to the second conductive line 114 among two parallel sides is smaller than a length of a side adjacent to the third conductive line 116 among the two parallel sides in a cross-sectional view. For example, referring to FIGS. 3 and 4, a trapezoidal cross-section of the second OTS film 163 contacting the first high-concentration electrode 171 may be inverted relative to a trapezoidal cross-section of the first OTS film 3 not contacting a high-concentration film, e.g., due to a difference in etch rate of high-concentration and high-density material.

In some embodiments, the second OTS film 163 may be in contact with the third electrode 161 and the first high-concentration electrode 171. A contact surface, e.g., interface, between the second OTS film 163 and the third electrode 161 may have a third dimension W3 in each of the first and second directions X and Y. A contact surface, e.g., interface, between the second OTS film 163 and the first high-concentration electrode 171 may have a fourth dimension W4 in each of the first and second directions X and Y. The fourth dimension W4 may be larger than the third dimension W3.

In some embodiments, the first dimension W1 may be equal to the fourth dimension W4. The second dimension W2 may be equal to the third dimension W3. Accordingly, a cross-section of the first OTS film 133 and a cross-section of the second OTS film 163 may be symmetric with each other around the second conductive line 114. In the first OTS film 133, the first dimension W1 may be larger than the second dimension W2. Thus, in the second OTS film 163, the fourth dimension W4 may be larger than the third dimension W3. Thus, the reliability of the semiconductor memory device may be improved.

In some embodiments, the first high-concentration electrode 171 may have a first vertical dimension H1 in the third direction Z. The fourth electrode 165 may have a second vertical dimension H2 in the third direction Z. The first vertical dimension H1 may be smaller than the second vertical dimension H2.

The semiconductor memory device according to some embodiments may further include a second cell insulating film 180. The second cell insulating film 180 may surround the second memory cell MC2. The second cell insulating film 180 may electrically insulate the second memory cells MC2 from each other. The second cell insulating film 180 may include an oxide-based insulating material. For example, the second cell insulating film 180 may include at least one of silicon oxide, silicon oxycarbide, and a low thermal conductivity material having lower thermal conductivity than that of silicon oxide.

In one example, the second cell insulating film 180 may include at least one of $SiO_2$, SiOC, SOG (Spin-On glass), SOD (Spin-On Dielectric), HDP (High Density Plasma) oxide, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), TEOS (Tetra Ethyl Ortho Silicate), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material and combinations thereof. In some embodiments, the second cell insulating film 180 may include FOX (Flowable Oxide).

FIGS. 5 to 10 are illustrative views of a semiconductor memory device according to some embodiments. For reference, FIGS. 5 to 10 are cross-sectional views along line A-A of FIG. 2. For convenience of description, the following description is based on differences relative to those described above with reference to FIGS. 2 to 4.

Figure 5:
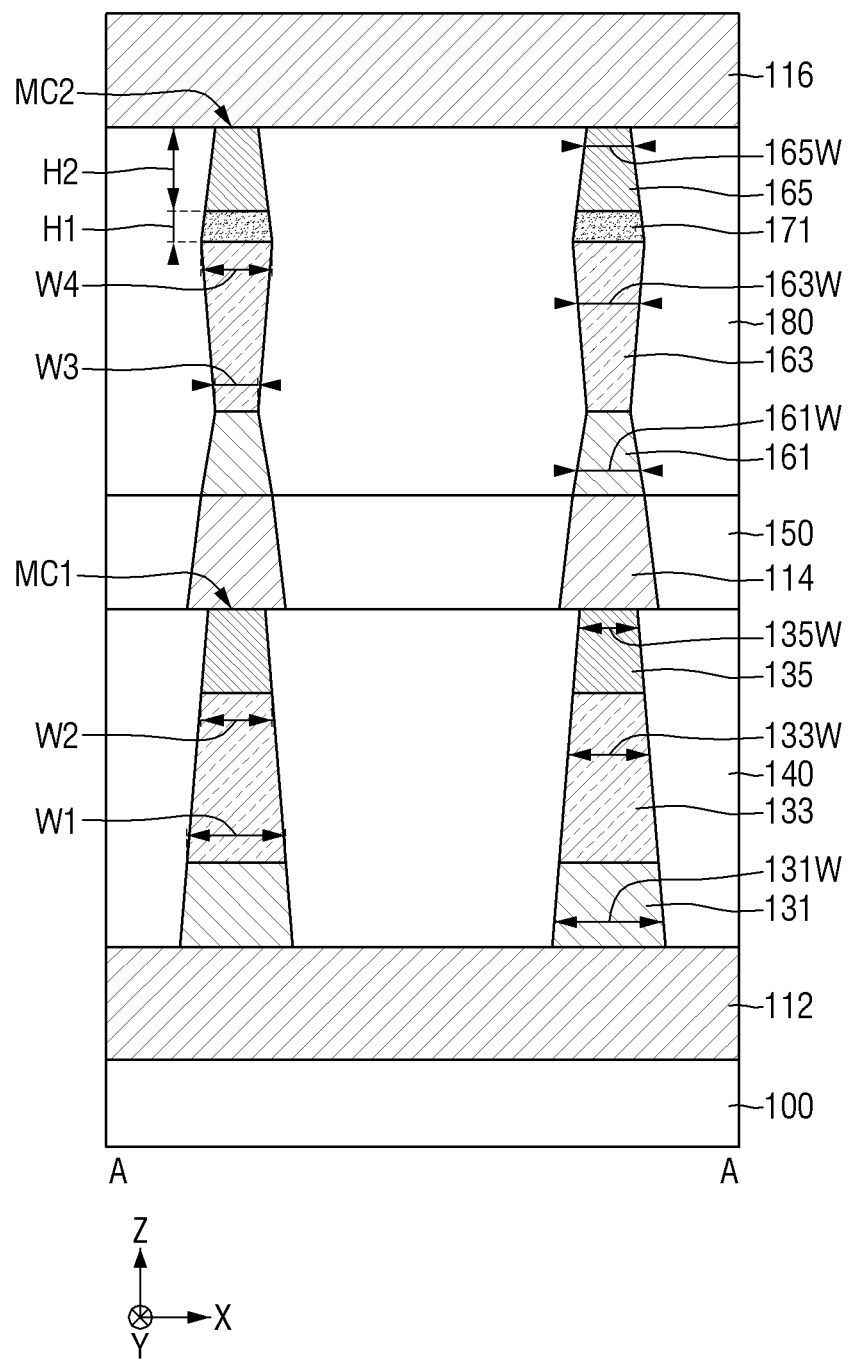
FIGS. 5 to 10 are views of a semiconductor memory device according to some embodiments.

Referring to FIG. 5, the first OTS film 133 and the second OTS film 163 may not be symmetric with each other around the second conductive line 114. For example, the fourth dimension W4 may be different from the first dimension W1. The second dimension W2 may be different from the third dimension W3. The fourth dimension W4 may be equal to the second dimension W2. The third dimension W3 may be smaller than the second dimension W2. The first dimension W1 may be greater than the fourth dimension W4.

Also in this case, the cross-section of the first OTS film 133 may have a trapezoidal shape in which a length of a side adjacent to the second electrode 135 among two parallel sides is smaller than a length of a side adjacent to the first electrode 131 among the two parallel sides. The cross-section of the second OTS film 163 may have a trapezoidal shape in which a length of a side adjacent to the third electrode 161 among two parallel sides is smaller than a length of a side adjacent to the fourth electrode 165 among the two parallel sides.

Figure 6:
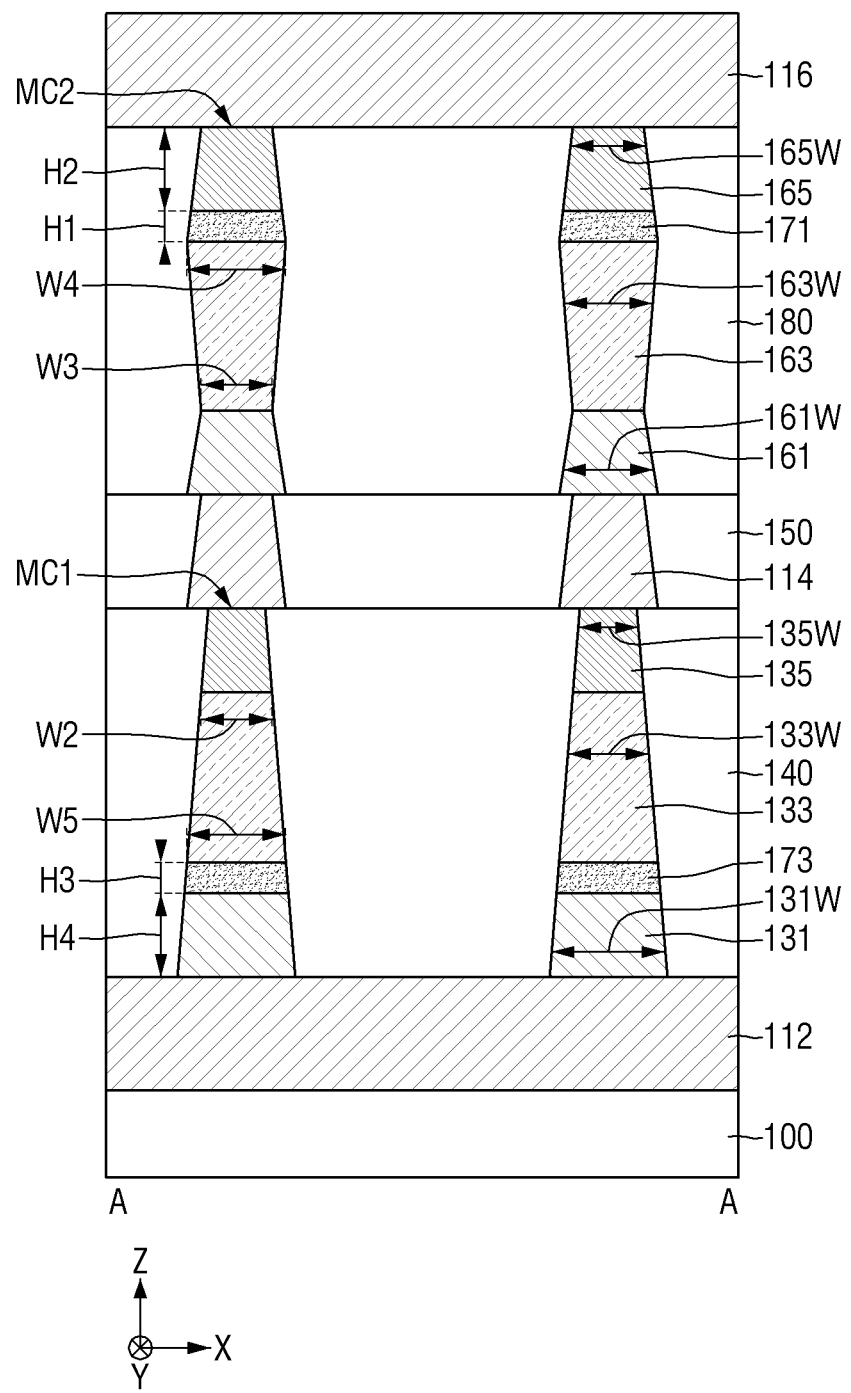

Referring to FIG. 6, the first memory cell MC1 may include a second high-concentration electrode 173. The second high-concentration electrode 173 may be disposed between the first electrode 131 and the first OTS film 133.

In detail, one end of the second high-concentration electrode 173 may be in contact with the first electrode 131. The other end of the second high-concentration electrode 173 may be in contact with the first OTS film 133. The second high-concentration electrode 173 may include carbon (C). Further, the second high-concentration electrode 173 may contain nitrogen (N). That is, the second high-concentration electrode 173 may be made of carbon (C) containing nitrogen (N).

In some embodiments, a concentration of nitrogen (N) contained in the second high-concentration electrode 173 may be greater than a concentration of nitrogen (N) contained in the first electrode 131. Impurity contained in the second high-concentration electrode 173 may not be nitrogen (N). Even in this case, a concentration of impurities contained in the second high-concentration electrode 173 may be greater than a concentration of impurities contained in the first electrode 131.

In some embodiments, a contact surface between the first OTS film 133 and the second high-concentration electrode 173 may have a fifth dimension W5 in each of the first and second directions X and Y. The fifth dimension W5 may be equal to the fourth dimension W4. The first OTS film 133 and the second OTS film 163 may be symmetric with each other around the second conductive line 114.

In some embodiments, the second high-concentration electrode 173 may have a third vertical dimension H3 in the third direction Z. The first electrode 131 may have a fourth vertical dimension H4 in the third direction Z. The third vertical dimension H3 may be smaller than the fourth vertical dimension H4. The first vertical dimension H1 may be equal to the third vertical dimension H3.

Figure 7:
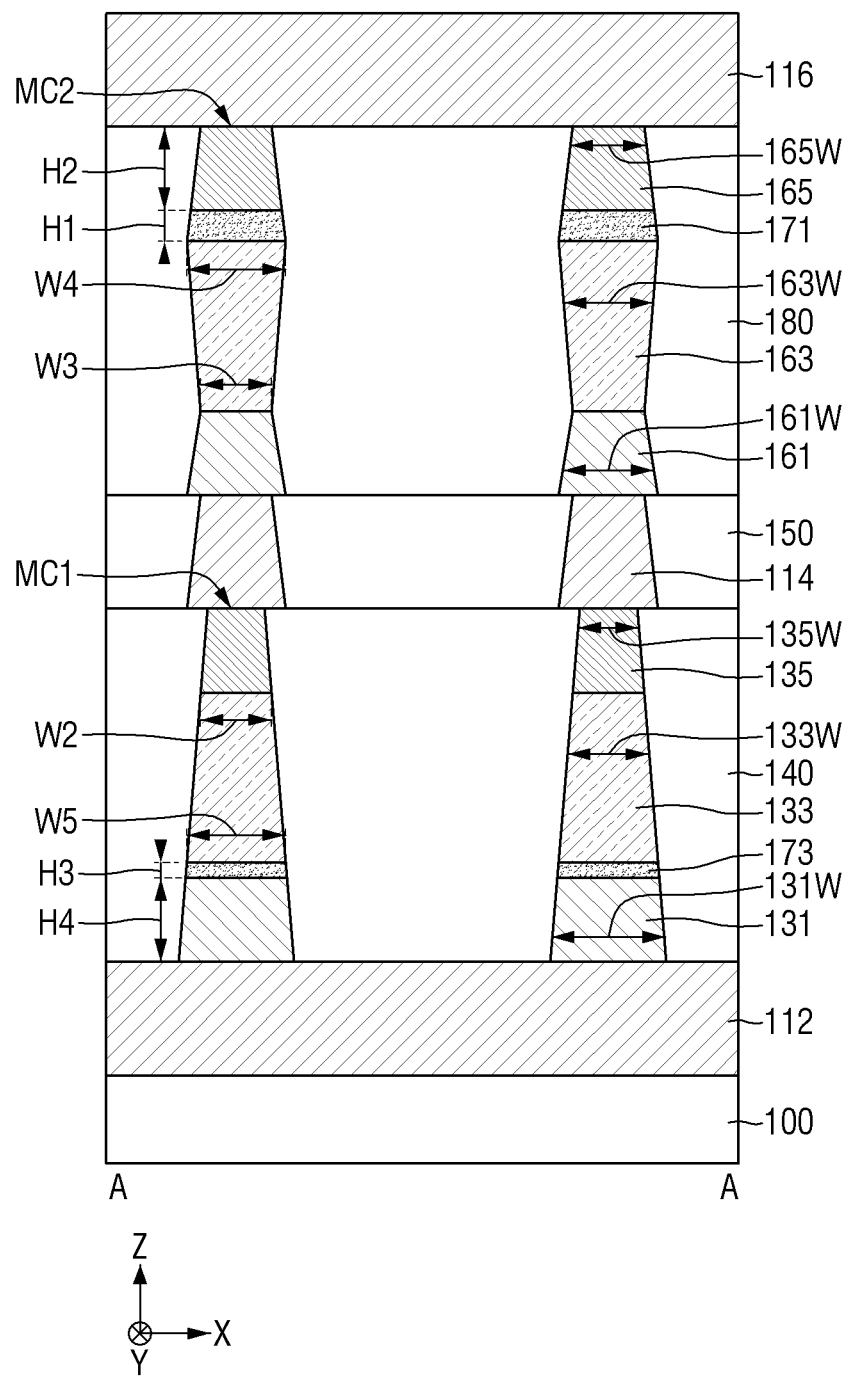

Referring to FIG. 7, the first memory cell MC1 may include the second high-concentration electrode 173. For convenience of description, the following description is based on differences relative to those described above with reference to FIG. 6.

In some embodiments, the second high-concentration electrode 173 may have the third vertical dimension H3 in the third direction Z. The first electrode 131 may have the fourth vertical dimension H4 in the third direction Z. The third vertical dimension H3 may be smaller than the fourth vertical dimension H4.

In some embodiments, the first vertical dimension H1 may be different from the third vertical dimension H3. In one example, the first vertical dimension H1 may be greater than the third vertical dimension H3.

Figure 8:
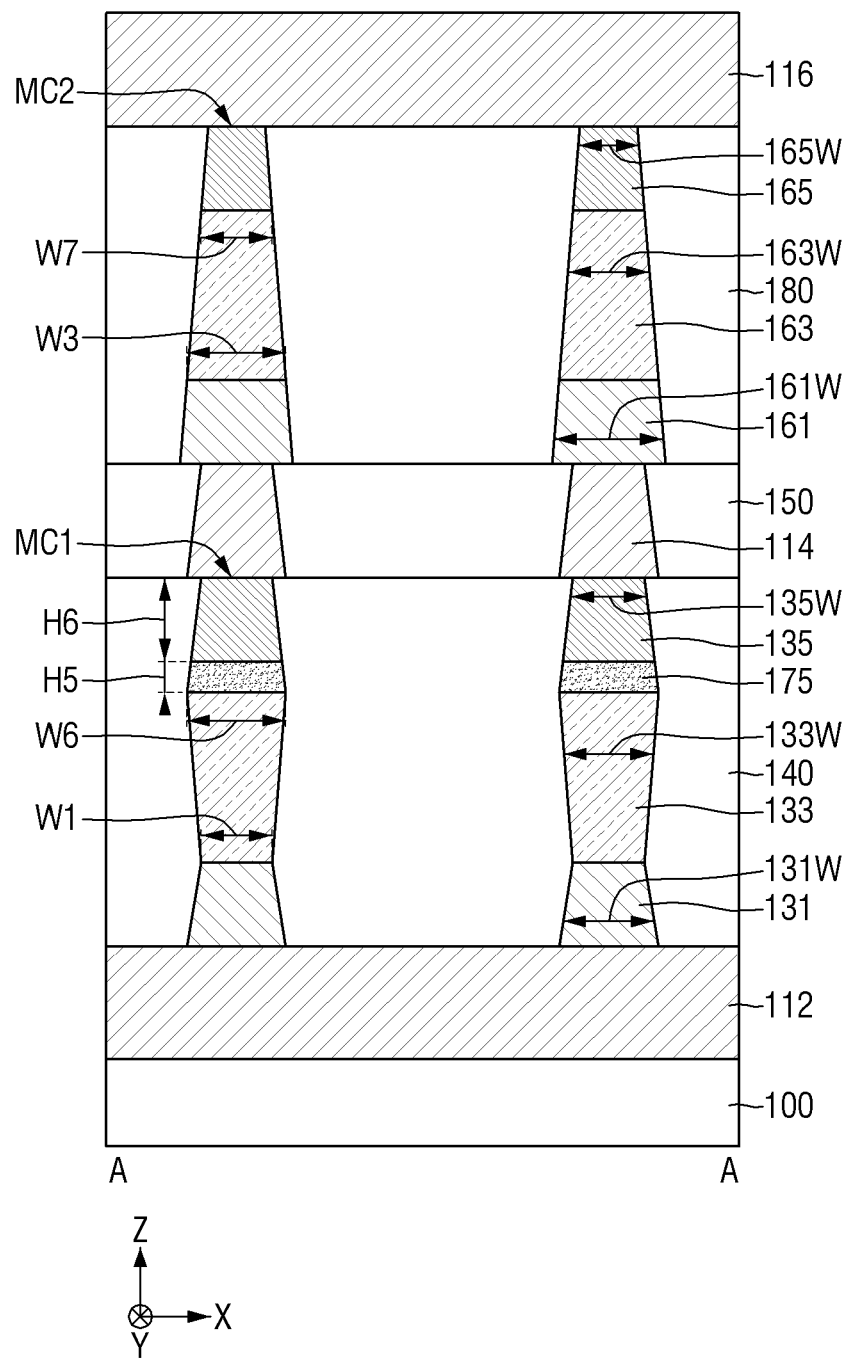

Referring to FIG. 8, the first memory cell MC1 may include a third high-concentration electrode 175. The second memory cell MC2 may not include the first high-concentration electrode (171 in FIG. 3).

The third high-concentration electrode 175 may be disposed between the first OTS film 133 and the second electrode 135. One end of the third high-concentration electrode 175 may be in contact with the first OTS film 133. The other end of the third high-concentration electrode 175 may contact the second electrode 135. The third high-concentration electrode 175 may include carbon (C). Further, the third high-concentration electrode 175 may contain nitrogen (N). That is, the third high-concentration electrode 175 may be made of carbon (C) containing nitrogen (N).

In some embodiments, a concentration of nitrogen (N) contained in the third high-concentration electrode 175 may be greater than a concentration of nitrogen (N) contained in the second electrode 135. The impurity contained in the third high-concentration electrode 175 may not be nitrogen (N). Even in this case, the concentration of impurities contained in the third high-concentration electrode 175 may be greater than the concentration of impurities contained in the second electrode 135.

In some embodiments, the dimension 133W in each of the first and second directions X and Y of the first OTS film 133 may be gradually increased as a distance thereof from the substrate 100 increases. The dimension 163W in each of the first and second directions X and Y of the second OTS film 163 may be gradually decreased as the film 163 extends away from the substrate 100. That is, each of the cross-section of the first OTS film 133 and the cross-section of the second OTS film 163 may have a trapezoidal shape. More specifically, the cross-section of the first OTS film 133 may have a trapezoidal shape in which a length of a side adjacent to the second electrode 135 among two parallel sides is greater than a length of a side adjacent to the first electrode 131 among the two parallel sides. The cross-section of the second OTS film 163 may have a trapezoidal shape in which a length of a side adjacent to the fourth electrode 165 among two parallel sides is smaller than a length of a side adjacent to the third electrode 161 among the two parallel sides.

In some embodiments, a contact surface between the first OTS film 133 and the third high-concentration electrode 175 may have a sixth dimension W6 in each of the first and second directions X and Y. A contact surface between the second OTS film 163 and the third electrode 161 may have the third dimension W3 in each of the first and second directions X and Y. Since the second memory cell MC2 does not include the first high-concentration electrode (171 in FIG. 3), the second OTS film 163 and the fourth electrode 165 may contact each other. A contact surface between the second OTS film 163 and the fourth electrode 165 may have a seventh dimension W7 in each of the first and second directions X and Y.

In some embodiments, the sixth dimension W6 may be equal to the third dimension W3. The seventh dimension W7 may be equal to the first dimension W1. The cross-section of the first OTS film 133 and the cross-section of the second OTS film 163 may be symmetric with each other around the second conductive line 114.

In some embodiments, the third high-concentration electrode 175 may have a fifth vertical dimension H5 in the third direction Z. The second electrode 135 may have a sixth vertical dimension H6 in the third direction Z. The fifth vertical dimension H5 may be smaller than the sixth vertical dimension H6.

Figure 9:
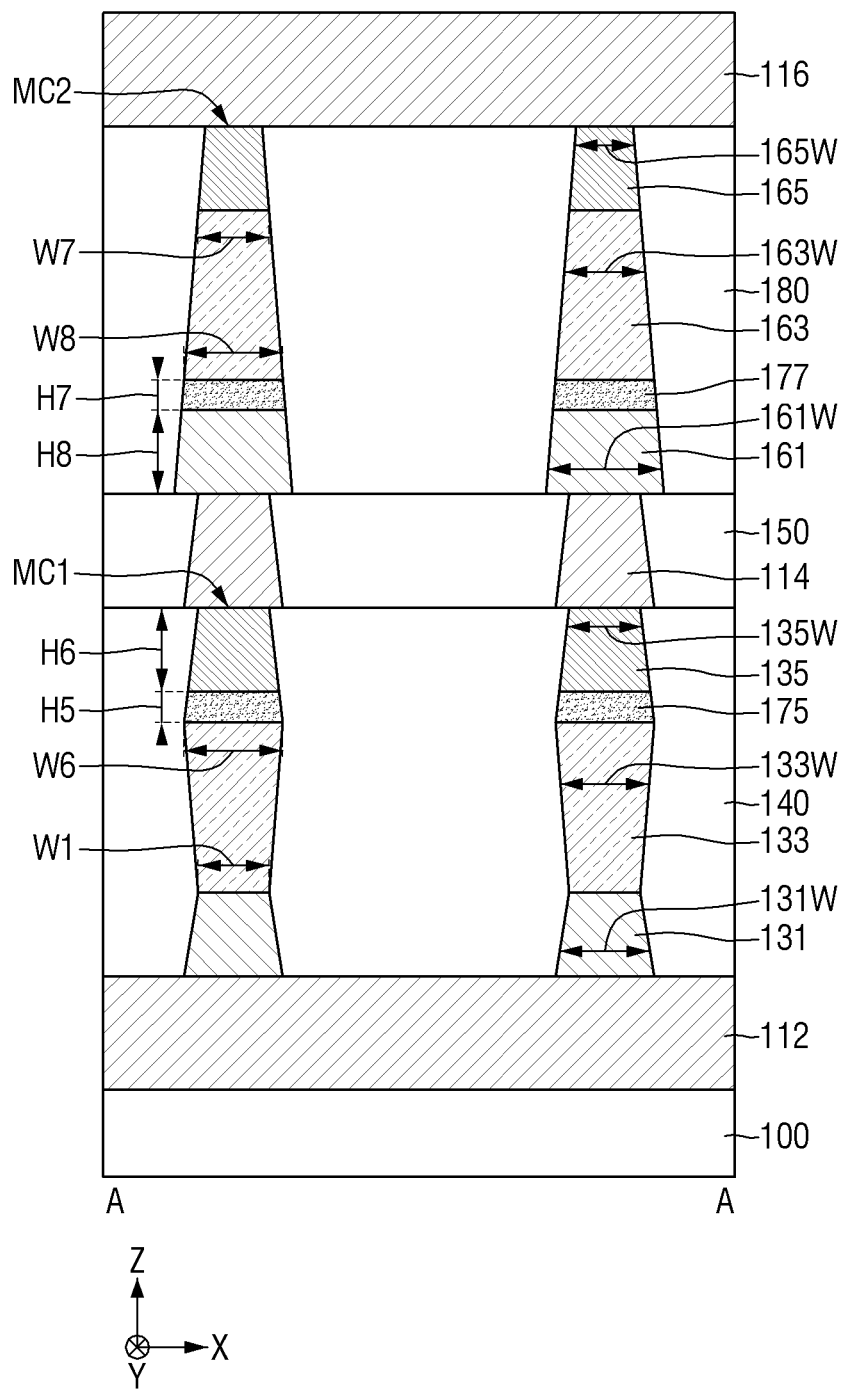

Referring to FIG. 9, the first memory cell MC1 may include a third high-concentration electrode 175, and the second memory cell MC2 may include a fourth high-concentration electrode 177. The second memory cell MC2 does not include the first high-concentration electrode (171 in FIG. 3). For convenience of description, the following description is based on differences relative to those described above with reference to FIG. 8.

The fourth high-concentration electrode 177 may be disposed between the third electrode 161 and the second OTS film 163. One end of the fourth high-concentration electrode 177 may be in contact with the third electrode 161. The other end of the fourth high-concentration electrode 177 may be in contact with the second OTS film 163. The fourth high-concentration electrode 177 may include carbon (C). Further, the fourth high-concentration electrode 177 may contain nitrogen (N). That is, the fourth high-concentration electrode 177 may be made of carbon (C) containing nitrogen (N).

In some embodiments, a concentration of nitrogen (N) contained in the fourth high-concentration electrode 177 may be greater than a concentration of nitrogen (N) contained in the third electrode 161. The impurity contained in the fourth high-concentration electrode 177 may not be nitrogen (N). Even in this case, the concentration of impurities contained in the fourth high-concentration electrode 177 may be greater than the concentration of impurities contained in the third electrode 161.

In some embodiments, the dimension 133W in each of the first and second directions X and Y of the first OTS film 133 may be gradually increased as a distance thereof from the substrate 100 increases. The dimension 163W in each of the first and second directions X and Y of the second OTS film 163 may be gradually decreased as the film 163 extends away from the substrate 100. That is, each of the cross-section of the first OTS film 133 and the cross-section of the second OTS film 163 may have a trapezoidal shape. More specifically, the cross-section of the first OTS film 133 may have a trapezoidal shape in which a length of a side adjacent to the second electrode 135 among two parallel sides is greater than a length of a side adjacent to the first electrode 131 among the two parallel sides. The cross-section of the second OTS film 163 may have a trapezoidal shape in which a length of a side adjacent to the fourth electrode 165 among two parallel sides is smaller than a length of a side adjacent to the third electrode 161 among the two parallel sides.

In some embodiments, a contact surface between the second OTS film 163 and the fourth high-concentration electrode 177 may have an eighth dimension W8 in each of the first and second directions X and Y. The eighth dimension W8 may be equal to the sixth dimension W6. The seventh dimension W7 may be equal to the first dimension W1. The cross-section of the first OTS film 133 and the cross-section of the second OTS film 163 may be symmetric with each other around the second conductive line 114.

In some embodiments, the fourth high-concentration electrode 177 may have a seventh vertical dimension H7 in the third direction Z. The third electrode 161 may have an eighth vertical dimension H8 in the third direction Z. The seventh vertical dimension H7 may be smaller than the eighth vertical dimension H8. In some embodiments, the seventh vertical dimension H7 and the fifth vertical dimension H5 may be equal to each other. However, the disclosure is not limited thereto.

Figure 10:
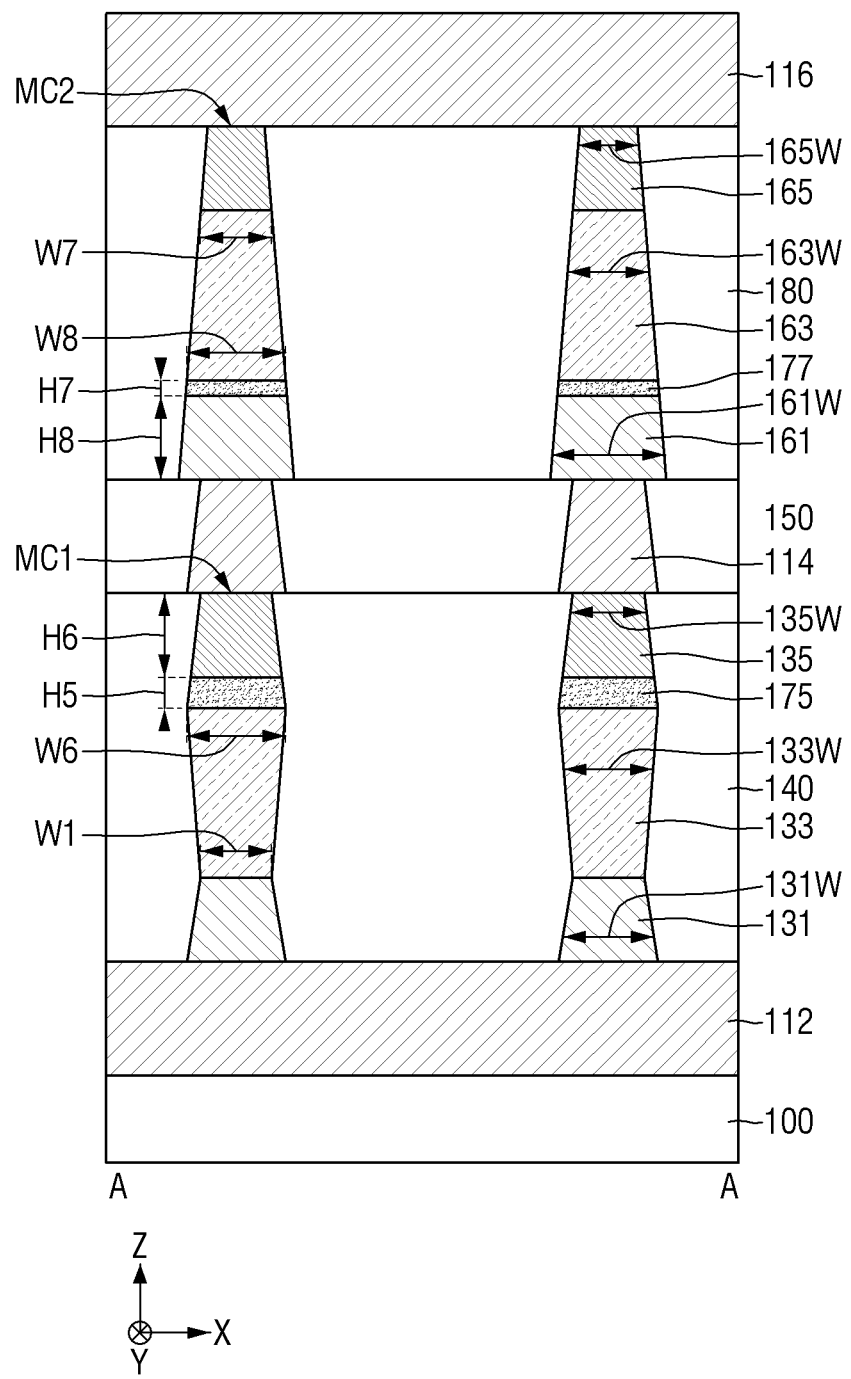

Referring to FIG. 10, the second memory cell MC2 may include the fourth high-concentration electrode 177. For convenience of description, the following description is based on differences relative to those described above with reference to FIG. 9.

In some embodiments, the seventh vertical dimension H7 of the fourth high-concentration electrode 177 in the third direction Z may be smaller than the fifth vertical dimension H5 of the third high-concentration electrode 175 in the third direction Z. The fourth high-concentration electrode 177 and the third high-concentration electrode 175 may not be symmetric with each other around the second conductive line 114.

Hereinafter, a method for manufacturing a semiconductor memory device according to some embodiments will be described with reference to FIGS. 11 to 18. FIGS. 11 to 18 are diagrams of stages in a manufacturing process of the semiconductor memory device having the cross-section of FIG. 3.

Figure 11:
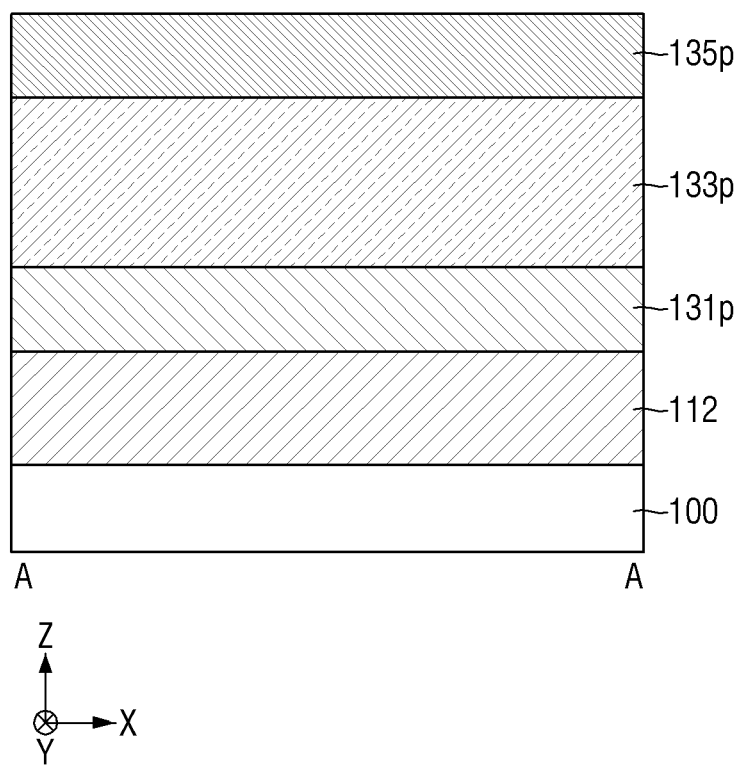
FIGS. 11 to 18 are stages in a manufacturing process of the semiconductor memory device having the cross-section of FIG. 3.

Referring to FIG. 11, the substrate 100 may be provided. The first conductive line 112 may be formed on the substrate 100. Although not shown, the first conductive line 112 may extend in the first direction X. At least one first conductive line 112 may be provided. The first conductive lines 112 may be spaced apart from each other in the second direction Y.

On the first conductive line 112, a pre-first electrode 131p, a pre-first OTS film 133p, and a pre-second electrode 135p may be sequentially formed. Each of the pre-first electrode 131p and the pre-second electrode 135p may include a conductive material. In one example, each of the pre-first electrode 131p and the pre-second electrode 135p may include carbon (C).

The pre-first OTS film 133p may include chalcogenide material. The chalcogenide material may include a compound as a combination of at least one of S, Te, and Se as chalcogen elements and at least one of Ge, Sb, Bi, Al, Tl, Sn, Zn, As, Si, In, Ti, Ga, and P.

In one embodiment, the pre-first OTS film 133p may include at least one of, e.g., GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

Figure 12:
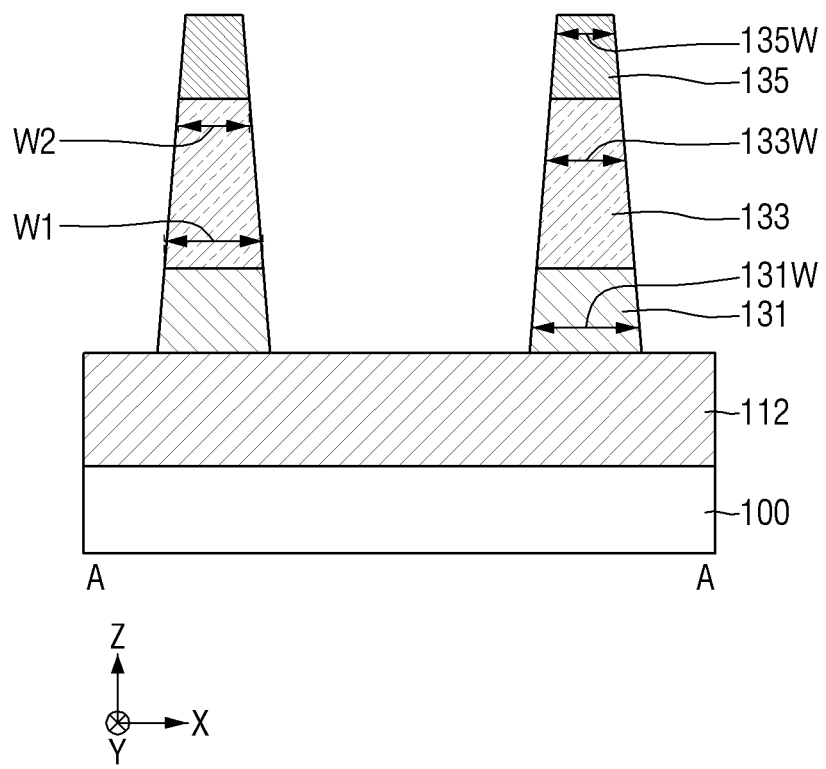

Referring to FIG. 12, the pre-second electrode 135p, the pre-first OTS film 133p, and the pre-first electrode 131p may be patterned. The first electrode 131, the first OTS film 133, and the second electrode 135 may be formed by patterning the pre-second electrode 135p, the pre-first OTS film 133p, and the pre-first electrode 131p.

The dimension 131W in each of the first and second directions X and Y of the first electrode 131 may decrease gradually as the electrode 131 extends away from a top surface of the substrate 100. The dimension 133W in each of the first and second directions X and Y of the first OTS film 133 may be gradually decreased as the film 133 extends away from the top surface of the substrate 100. The dimension 135W in each of the first and second directions X and Y of the second electrode 135 may decrease gradually as the electrode 135 extends away from the top surface of the substrate 100.

Figure 13:
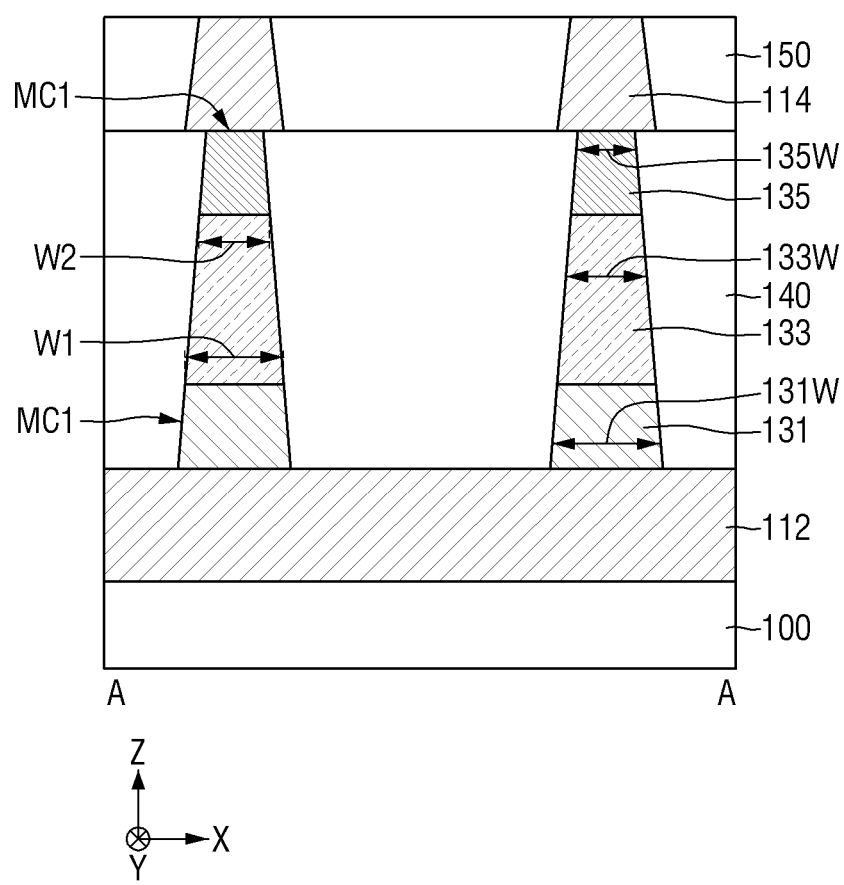

Referring to FIG. 13, the first memory cell MC1 may be formed. The first memory cell MC1 may include the first electrode 131, the first OTS film 133, and the second electrode 135. Subsequently, the first cell insulating film 140 surrounding the first memory cell MC1 may be formed.

The second conductive line 114 and the second interlayer insulating film 150 may be formed on the first cell insulating film 140. The second conductive line 114 may extend in the second direction Y. The second conductive lines 114 may be spaced apart from each other in the first direction X.

Figure 14:
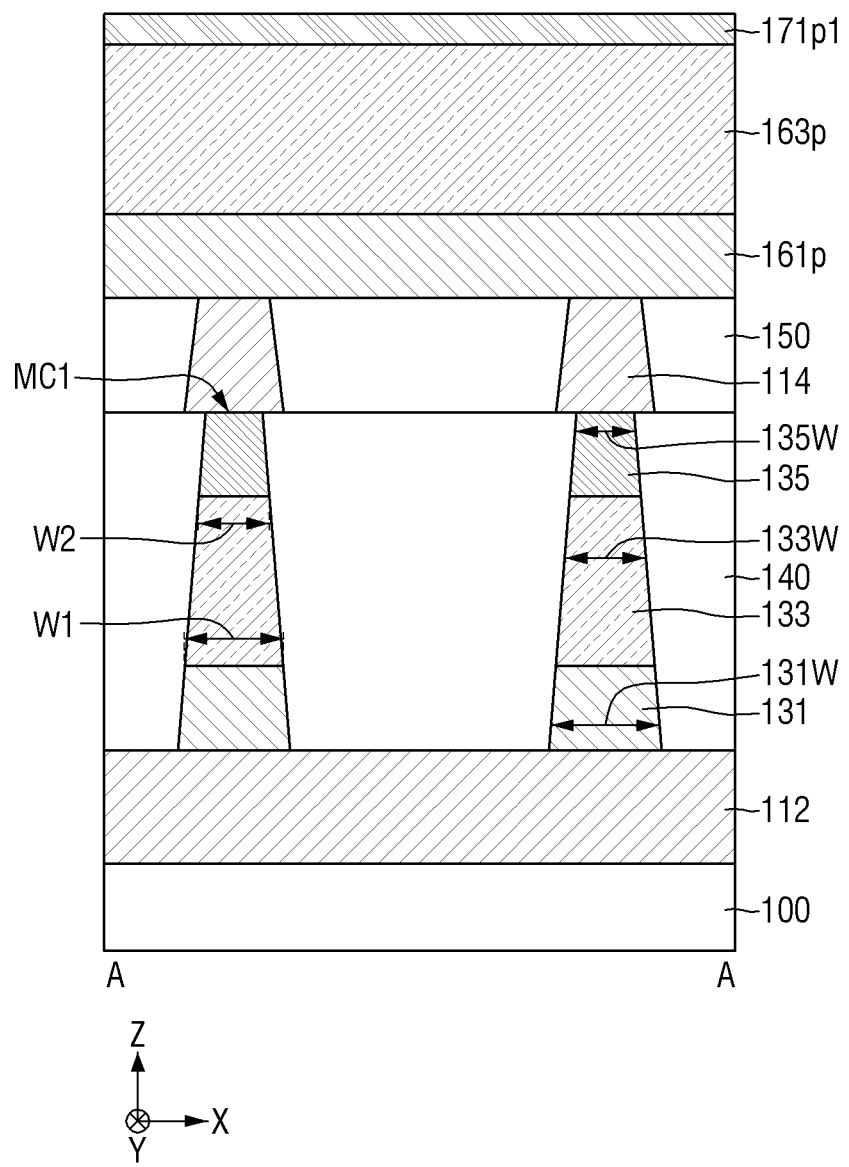

Referring to FIG. 14, a pre-third electrode 161p, a pre-second OTS film 163p, and a first pre-first high-concentration electrode 171p1 may be sequentially formed on the second conductive line.

The pre-third electrode 161p may include a conductive material. In one example, the pre-third electrode 161p may include carbon (C).

The pre-second OTS film 163p may include chalcogenide material. The chalcogenide material may include a compound as a combination of at least one of S, Te, and Se as chalcogen elements and at least one of Ge, Sb, Bi, Al, Tl, Sn, Zn, As, Si, In, Ti, Ga, and P.

In one example, the pre-second OTS film 163p may include at least one of, e.g., GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The first pre-first high-concentration electrode 171p1 may include a conductive material. In one example, the first pre-first high-concentration electrode 171p1 may include carbon (C).

Figure 15:
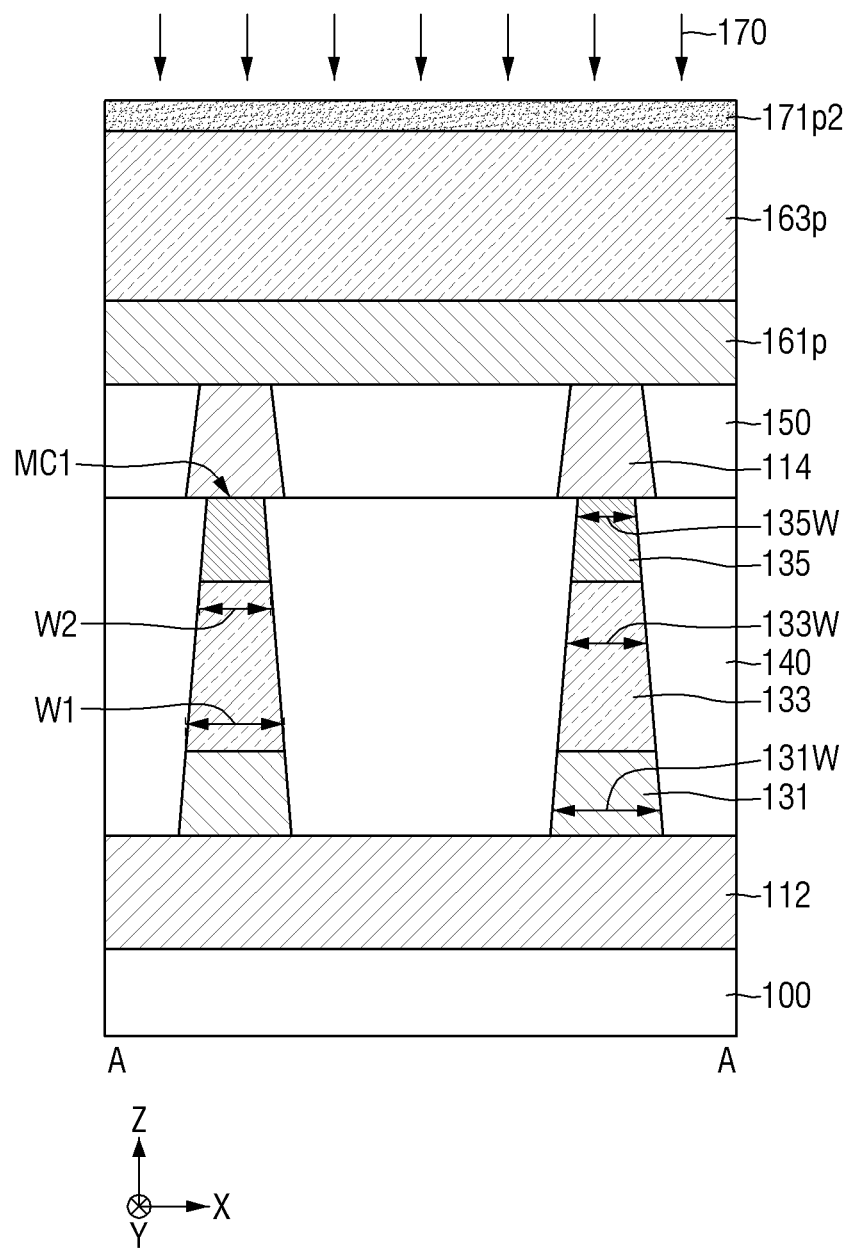

Referring to FIG. 15, an ion implantation process 170 may be performed. Ions may be implanted on a surface of the first pre-first high-concentration electrode (171p1 in FIG. 14). The ions may be nitrogen (N) ions.

The ion implantation process 170 may be performed to form a second pre-first high-concentration electrode 171p2. The second pre-first high-concentration electrode 171p2 may include carbon (C) containing nitrogen (N). A concentration of nitrogen (N) contained in the second pre-first high-concentration electrode 171p2 is greater than a concentration of nitrogen (N) contained in the pre-third electrode 161p.

Figure 16:
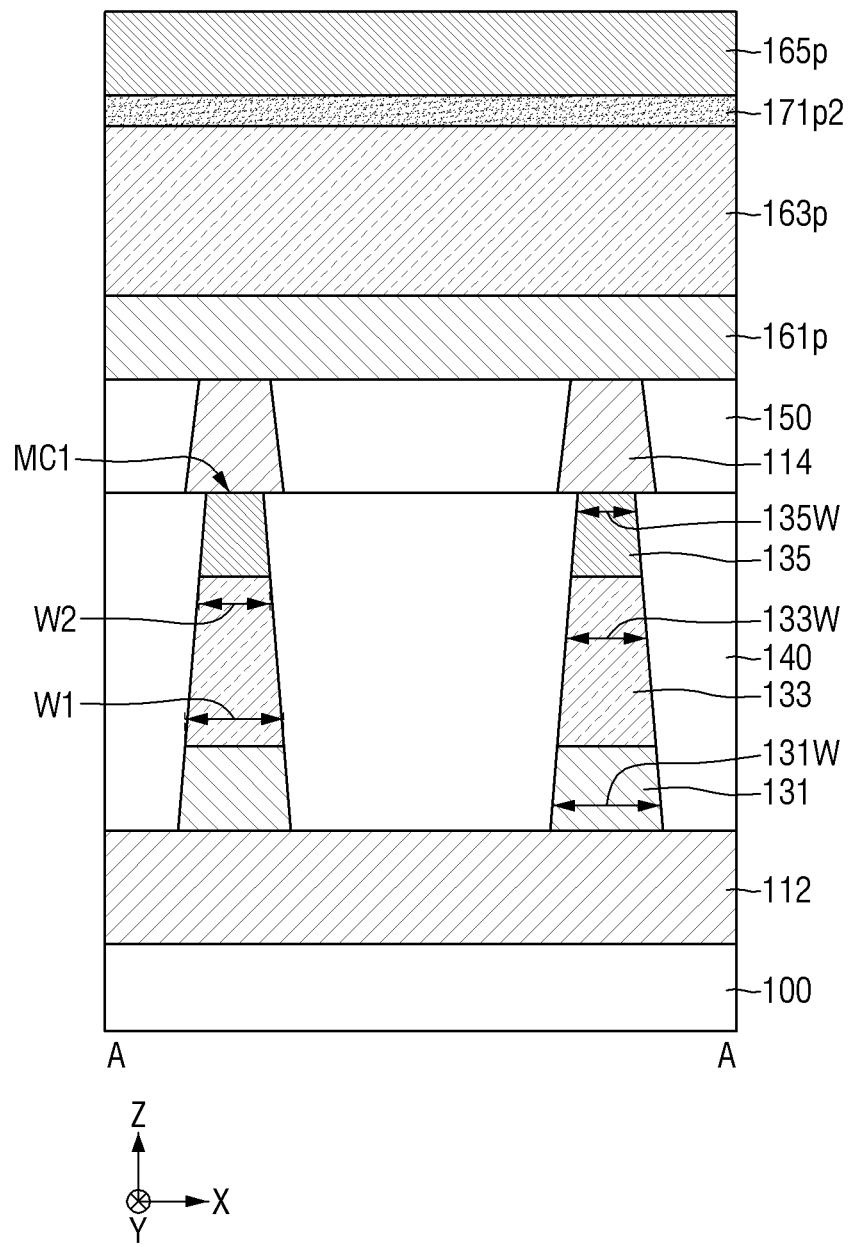

Referring to FIG. 16, a pre-fourth electrode 165p may be formed on the second pre-first high-concentration electrode 171p2. The pre-fourth electrode 165p may include a conductive material. The pre-fourth electrode 165p may include carbon (C). A concentration of nitrogen (N) contained in the second pre-first high-concentration electrode 171p2 may be greater than a concentration of nitrogen (N) contained in the pre-fourth electrode 165p.

Figure 17:
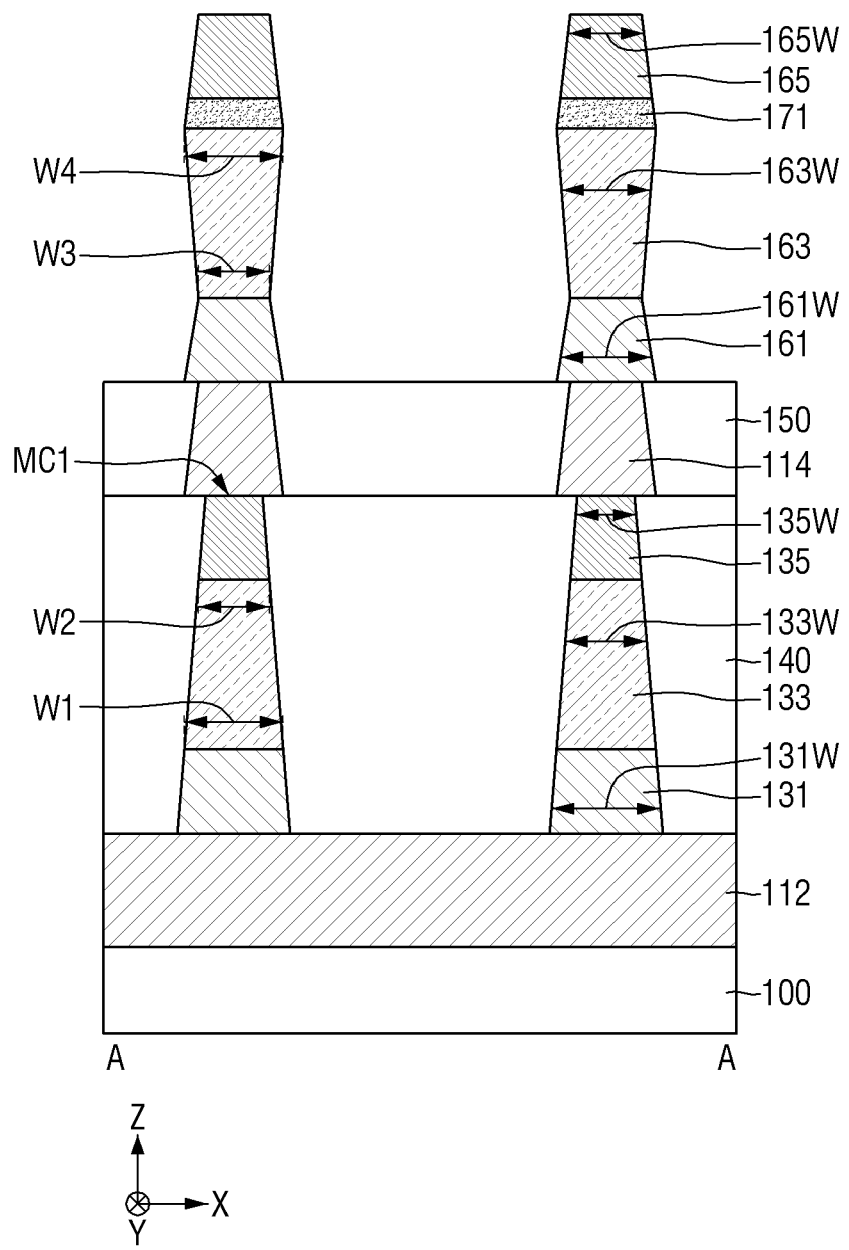

Referring to FIG. 17, the pre-fourth electrode 165p, the second pre-first high-concentration electrode 171p2, the pre-second OTS film 163p, and the pre-third electrode 161p may be patterned. The pre-fourth electrode 165p, the second pre-first high-concentration electrode 171p2, the pre-second OTS film 163p, and the pre-third electrode 161p may be patterned to form the fourth electrode 165, the first high-concentration electrode 171, the second OTS film 163, and the third electrode 161, respectively.

In some embodiments, the dimension 165W in each of the first and second directions X and Y of the fourth electrode 165 may decrease gradually as the electrode 165 extends away from the substrate 100. On the contrary, the dimension 163W in each of the first and second directions X and Y of the second OTS film 163 gradually increases as the film 163 extends away from the substrate 100. As the first high-concentration electrode 171 is disposed adjacent to the second OTS film 163, an etch rate of a portion of the second OTS film 163 adjacent to the first high-concentration electrode 171 may be lower than an etch rate of a portion of the second OTS film 163 not adjacent to the first high-concentration electrode 171. Accordingly, the dimension 163W in each of the first and second directions X and Y of the second OTS film 163 may be larger as the film 163 is closer to the first high-concentration electrode 171.

As the above process proceeds, the cross-section of the first OTS film 133 and the cross-section of the second OTS film 163 may be symmetric with each other around the second conductive line 114. As a result, a semiconductor memory device with improved reliability may be manufactured.

Figure 18:
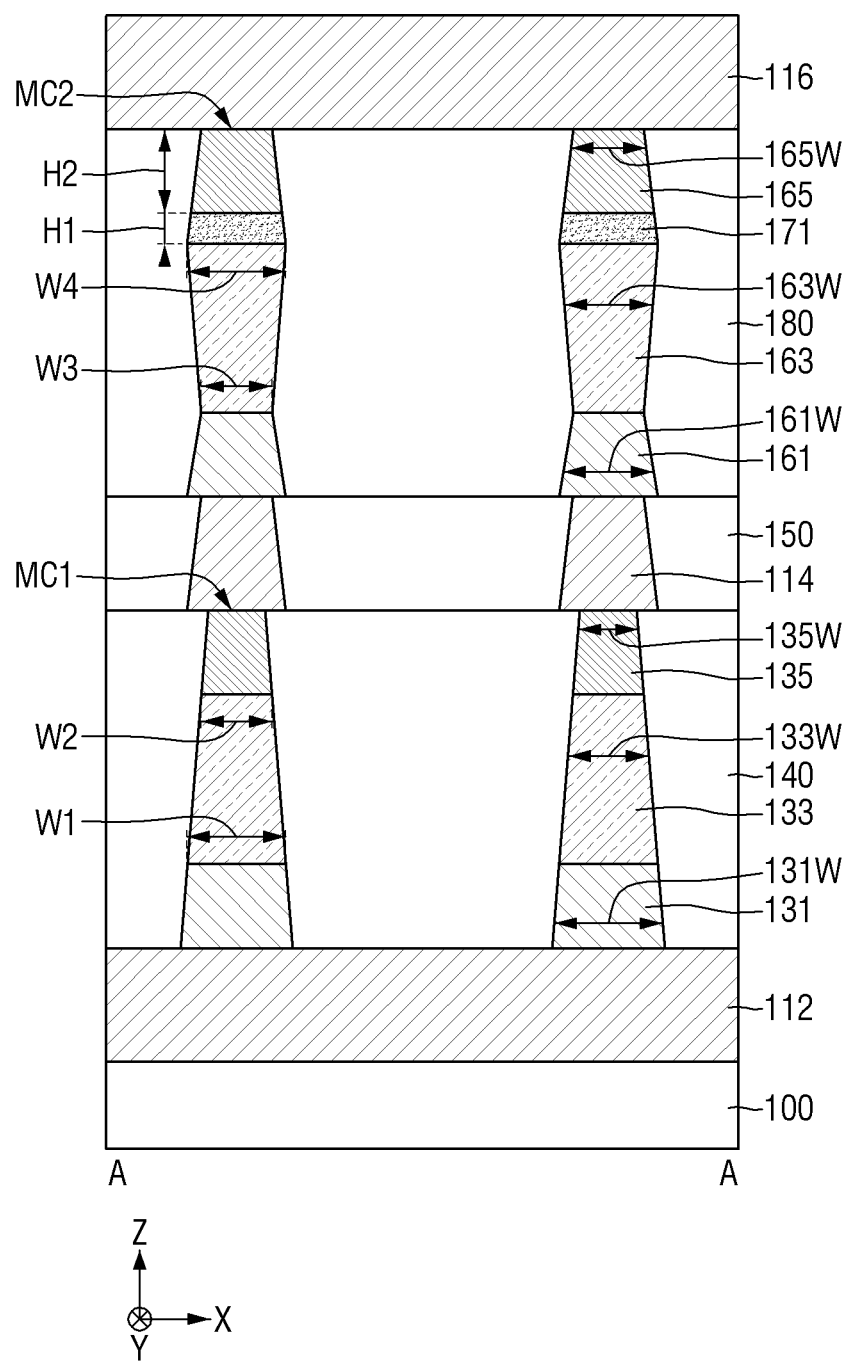

Referring to FIG. 18, the second memory cell MC2 may be formed. The second memory cell MC2 may include the third electrode 161, the second OTS film 163, the first high-concentration electrode 171, and the fourth electrode 165. Subsequently, the second cell insulating film 180 surrounding the second memory cell MC2 may be formed.

The third conductive line 116 may be formed on the second cell insulating film 180. The third conductive line 116 may extend in the first direction X. The third conductive lines 116 may be spaced apart from each other in the second direction Y.

By way of summation and review, example embodiments provide a semiconductor memory device with improved reliability. That is, according to embodiments, a semiconductor memory device may include a high-concentration film on an ovonic threshold switch film, so the ovonic threshold switch film has a negative slope (rather than a positive sloe), e.g., a trapezoidal cross-section of the ovonic threshold switch film contacting the high-concentration film may be inverted relative to a trapezoidal cross-section of an ovonic threshold switch film not contacting a high-concentration film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor memory device, comprising:
   a substrate;
   a first conductive line on the substrate and extending in a first direction;
   a second conductive line on the first conductive line and extending in a second direction, the second direction intersecting the first direction; and
   a memory cell between the first conductive line and the second conductive line, the memory cell including:
      a first electrode connected to the first conductive line,
      a second electrode connected to the second conductive line,
      an ovonic threshold switch (OTS) film between the first electrode and the second electrode, a logic state of data stored in the OTS film being based on a polarity of a program voltage, and
      a high-concentration electrode between the second electrode and the OTS film, a concentration of nitrogen in the second electrode being lower than a concentration of nitrogen in the high-concentration electrode.

2. The device as claimed in claim 1, wherein a dimension in each of the first direction and the second direction of the OTS film gradually increases as the OTS film extends away from the substrate.

3. The device as claimed in claim 1,
wherein the OTS film includes a first surface in contact with the first electrode and a second surface in contact with the high-concentration electrode, a dimension in each of the first direction and the second direction of the first surface is smaller than a dimension in each of the first direction and the second directions of the second surface.

4. The device as claimed in claim 3, wherein the logic state of the data stored in the OTS film is based on a concentration of ions at each of the first surface and the second surface.

5. The device as claimed in claim 1, wherein a dimension in each of the first direction and the second direction of each of the first electrode and the second electrode gradually decreases, as each of the first electrode and the second electrode extends away from the substrate.

6. The device as claimed in claim 1, wherein a vertical dimension of the high-concentration electrode is smaller than a vertical dimension of the second electrode.

7. A semiconductor memory device, comprising:
a substrate;
a first conductive line on the substrate and extending in a first direction;
a second conductive line on the first conductive line and extending in a second direction, the second direction intersecting the first direction;
a third conductive line on the second conductive line and extending in the first direction;
a first memory cell between the first conductive line and the second conductive line, the first memory cell including a first electrode, a first ovonic threshold switch (OTS) film, and a second electrode sequentially stacked; and
a second memory cell between the second conductive line and the third conductive line, the second memory cell including a third electrode, a second OTS film, a first high-concentration electrode, and a fourth electrode sequentially stacked, a concentration of nitrogen in the first high-concentration electrode being greater than a concentration of nitrogen in the fourth electrode.

8. The device as claimed in claim 7, wherein a logic state of data stored in each of the first OTS film and the second OTS film is based on a concentration of ions at each of a surface of the first OTS film and a surface of the second OTS film.

9. The device as claimed in claim 7,
wherein the concentration of nitrogen in the fourth electrode is equal to a concentration of nitrogen in each of the first electrode, the second electrode. and the third electrode.

10. The device as claimed in claim 7, wherein:
a dimension in each of the first direction and the second direction of the first OTS film gradually decreases as the first OTS film extends away from the substrate, and
a dimension in each of the first direction and the second direction of the second OTS film gradually increases as the second OTS film extends away from the substrate.

11. The device as claimed in claim 7, wherein:
a dimension in each of the first direction and the second direction of the first OTS film gradually increases as the first OTS film extends away from the substrate, and
a dimension in each of the first direction and the second direction of the second OTS film gradually decreases as the second OTS film extends away from the substrate.

12. The device as claimed in claim 7, wherein a vertical dimension of the first high-concentration electrode is smaller than a vertical dimension of the fourth electrode.

13. The device as claimed in claim 7, further comprising a second high-concentration electrode between the first electrode and the first OTS film, a concentration of nitrogen in the second high-concentration electrode being greater than a concentration of nitrogen in the first electrode.

14. The device as claimed in claim 13, wherein:
the first OTS film includes a first surface in contact with the second high-concentration electrode,
the second OTS film includes a second surface in contact with the first high-concentration electrode, and
a dimension in each of the first direction and the second direction of the first surface is smaller than a dimension in each of the first direction and the second direction of the second surface.

15. A semiconductor memory device, comprising:
a substrate;
a first conductive line on the substrate and extending in a first direction;
a second conductive line on the first conductive line and extending in a second direction, the second direction intersecting the first direction;
a third conductive line on the second conductive line and extending in the first direction;
a first memory cell between the first conductive line and the second conductive line, the first memory cell including a first electrode, a first ovonic threshold switch (OTS) film, and a second electrode sequentially stacked, and a dimension in each of the first direction and the second direction of the first OTS film gradually decreases as the first OTS film extends away from the substrate; and
a second memory cell between the second conductive line and the third conductive line, the second memory cell including a third electrode, a second OTS film, a first high-concentration electrode, and a fourth electrode sequentially stacked, and a dimension in each of the first direction and the second direction of the second OTS film gradually increases as the second OTS film extends away from the substrate.

16. The device as claimed in claim 15, wherein a logic state of data stored in each of the first OTS film and the second OTS film is based on a concentration of ions at each of a surface of the first OTS film and a surface of the second OTS film.

17. The device as claimed in claim 15, wherein a concentration of nitrogen in the first high-concentration electrode is greater than a concentration of nitrogen in the fourth electrode.

18. The device as claimed in claim 15, wherein a vertical dimension of the first high-concentration electrode is smaller than a vertical dimension of the fourth electrode.

19. The device as claimed in claim 15, wherein the first memory cell further includes a second high-concentration electrode between the first electrode and the first OTS film, a concentration of nitrogen in the second high-concentration electrode being greater than a concentration of nitrogen in the first electrode.

20. The device as claimed in claim 19, wherein:
the first OTS film includes a first surface in contact with the second high-concentration electrode,
the second OTS film includes a second surface in contact with the first high-concentration electrode, and a dimension in each of the first direction and the second direction of the first surface is equal to a dimension in each of the first direction and the second direction of the second surface.

* * * * *